(12) United States Patent
Flanigan et al.

(10) Patent No.: US 9,966,898 B1
(45) Date of Patent: May 8, 2018

(54) BUILDING INTEGRATED PHOTOVOLTAIC SYSTEM FOR TILE ROOFS

(71) Applicant: SolarCity Corporation, San Mateo, CA (US)

(72) Inventors: Daniel Preston Flanigan, Petaluma, CA (US); Jack Raymond West, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days. days.

(21) Appl. No.: 15/399,712

(22) Filed: Jan. 5, 2017

Related U.S. Application Data

(60) Provisional application No. 62/413,298, filed on Oct. 26, 2016.

(51) Int. Cl.
*H02S 20/25* (2014.01)
*H02S 40/36* (2014.01)

(52) U.S. Cl.
CPC .............. *H02S 20/25* (2014.12); *H02S 40/36* (2014.12)

(58) Field of Classification Search
CPC ......... Y02B 10/12; H02S 20/23; H02S 20/25; H02S 20/26; H02S 40/36; H02S 40/38; Y02E 10/50; E04D 1/26
(Continued)

(56) References Cited

U.S. PATENT DOCUMENTS 4,040,867 A  8/1977 Forestieri et al.
4,111,188 A  9/1978 Murphy, Jr.
(Continued)

FOREIGN PATENT DOCUMENTS

DE  202009002209 U1  7/2010
DE  202010005806 U1  11/2010
(Continued)

OTHER PUBLICATIONS

Burkart, Karl, "*Solar innovations: Integrated 'coolroof' solar shingles*," Mother Nature Network, website: www.mnn.com/greentech/research-innovations/blogs/solar-innovations-integrated-coolroof-solar-shingles, published Dec. 19, 2008, 3 pages.
(Continued)

*Primary Examiner* — Brent W Herring
(74) *Attorney, Agent, or Firm* — Kilpatrick Townsend & Stockton LLP

(57) ABSTRACT

Building integrated photovoltaic (BIPV) systems provide for solar panel arrays that can be aesthetically pleasing to an observer, with minimal visible difference between photovoltaic and non-photovoltaic areas of the BIPV system. BIPV systems can be incorporated as part of roof surfaces as built into the structure of the roof, particularly as roofing tiles that have photovoltaic elements embedded or incorporated into the body of the roofing tiles. BIPV systems can also include mimic or dummy tiles that appear similar to tiles with photovoltaic elements, but do not collect solar energy. In some configurations, the appearance of BIPV tile roof systems can be generally uniform to an observer at ground level, where the blending and distribution of photovoltaic and non-photovoltaic elements generate a consistent and elegant appearance that camouflages any differences between photovoltaic tile or non-photovoltaic tiles.

15 Claims, 13 Drawing Sheets

(58) Field of Classification Search
USPC .......................................... 52/173.3; 136/244
See application file for complete search history.

(56) References Cited

U.S. PATENT DOCUMENTS

| | | | |
|---|---|---|---|
| 4,197,833 A | 4/1980 | Pelish | |
| 4,202,319 A | 5/1980 | Vinz | |
| 4,221,208 A | 9/1980 | Murphy, Jr. | |
| 4,237,861 A | 12/1980 | Fayard et al. | |
| 4,319,437 A | 3/1982 | Murphy | |
| 4,428,360 A | 1/1984 | Cohen | |
| 4,428,361 A | 1/1984 | Straza | |
| 4,946,512 A | 8/1990 | Fukuroi et al. | |
| 5,022,381 A | 6/1991 | Allegro | |
| 5,482,569 A | 1/1996 | Ihara et al. | |
| 5,509,246 A | 4/1996 | Roddy | |
| 5,575,861 A | 11/1996 | Younan et al. | |
| 5,651,226 A | 7/1997 | Archibald | |
| 5,986,203 A | 11/1999 | Hanoka et al. | |
| 6,453,629 B1 | 9/2002 | Nakazima et al. | |
| 6,856,496 B1 | 2/2005 | Mucci et al. | |
| 6,906,253 B2 | 6/2005 | Bauman et al. | |
| 7,328,534 B2 | 2/2008 | Dinwoodie | |
| 7,465,873 B2 | 12/2008 | Nomura et al. | |
| 7,678,990 B2* | 3/2010 | McCaskill | E04D 1/26 |
| | | | 136/244 |
| 7,678,991 B2* | 3/2010 | McCaskill | E04D 1/26 |
| | | | 136/244 |
| 7,713,089 B2 | 5/2010 | Faust et al. | |
| 7,858,874 B2 | 12/2010 | Ruskin et al. | |
| 8,168,880 B2* | 5/2012 | Jacobs | E04D 1/26 |
| | | | 136/244 |
| 8,209,920 B2* | 7/2012 | Krause | H01L 31/02008 |
| | | | 136/244 |
| 8,215,070 B2* | 7/2012 | Railkar | E04D 12/004 |
| | | | 52/173.3 |
| 8,309,840 B2* | 11/2012 | Stevens | F24J 2/5245 |
| | | | 126/622 |
| 8,312,693 B2 | 11/2012 | Cappelli | |
| 8,333,040 B2 | 12/2012 | Shiao et al. | |
| 8,468,754 B2 | 6/2013 | Railkar et al. | |
| 8,468,756 B2 | 6/2013 | Arguelles | |
| 8,476,523 B2 | 7/2013 | Bennett | |
| 8,511,006 B2 | 8/2013 | Reisdorf et al. | |
| 8,603,613 B2 | 12/2013 | Larson | |
| 8,607,510 B2 | 12/2013 | Daniels | |
| 8,613,170 B2 | 12/2013 | De Nardis | |
| 8,621,813 B2 | 1/2014 | Dube | |
| 8,671,630 B2 | 3/2014 | Lena et al. | |
| 8,713,860 B2 | 5/2014 | Railkar et al. | |
| 8,776,455 B2* | 7/2014 | Azoulay | H02S 20/25 |
| | | | 126/622 |
| 8,782,972 B2 | 7/2014 | Grieco | |
| 8,833,005 B1* | 9/2014 | Croft | H02S 40/38 |
| | | | 126/622 |
| 8,863,451 B2* | 10/2014 | Jenkins | E04D 13/00 |
| | | | 126/623 |
| 8,875,454 B2 | 11/2014 | Arguelles | |
| 8,943,766 B2* | 2/2015 | Gombarick, Jr. | H01L 31/03926 |
| | | | 52/173.3 |
| 8,994,224 B2 | 3/2015 | Mehta et al. | |
| 9,038,330 B2 | 5/2015 | Bellavia | |
| 9,166,523 B2 | 10/2015 | Kiik et al. | |
| 9,169,646 B2 | 10/2015 | Rodrigues et al. | |
| 9,184,325 B2 | 11/2015 | Schulze et al. | |
| 9,273,885 B2* | 3/2016 | Rodrigues | H02S 40/32 |
| 9,455,663 B1 | 9/2016 | Carrington | |
| 2005/0178429 A1* | 8/2005 | McCaskill | E04D 1/26 |
| | | | 136/251 |
| 2005/0178430 A1* | 8/2005 | McCaskill | E04D 1/26 |
| | | | 136/251 |
| 2006/0032527 A1* | 2/2006 | Stevens | F24J 2/5245 |
| | | | 136/251 |
| 2006/0225780 A1* | 10/2006 | Johnson, III | F24J 2/5211 |
| | | | 136/244 |
| 2008/0302031 A1* | 12/2008 | Bressler | H02S 40/34 |
| | | | 52/173.3 |
| 2009/0159118 A1 | 6/2009 | Kalkanoglu et al. | |
| 2009/0194143 A1* | 8/2009 | Jacobs | H02S 20/23 |
| | | | 136/244 |
| 2009/0205270 A1* | 8/2009 | Shaw | H02S 20/23 |
| | | | 52/173.3 |
| 2009/0223550 A1* | 9/2009 | Curtin | F24J 2/0455 |
| | | | 136/244 |
| 2010/0313499 A1 | 12/2010 | Gangemi | |
| 2011/0000535 A1* | 1/2011 | Davidson | E04D 3/32 |
| | | | 136/256 |
| 2011/0017278 A1 | 1/2011 | Kalkanoglu et al. | |
| 2011/0132427 A1 | 6/2011 | Kalkanoglu et al. | |
| 2011/0225904 A1* | 9/2011 | Railkar | E04D 12/004 |
| | | | 52/173.3 |
| 2011/0289867 A1* | 12/2011 | Balbo Di Vinadio | E04D 1/04 |
| | | | 52/173.3 |
| 2012/0017972 A1* | 1/2012 | Jenkins | E04D 1/26 |
| | | | 136/252 |
| 2012/0085040 A1* | 4/2012 | Ketwitz, Jr. | H01L 31/05 |
| | | | 52/173.3 |
| 2012/0151856 A1* | 6/2012 | Azoulay | H02S 20/25 |
| | | | 52/173.3 |
| 2012/0174505 A1* | 7/2012 | Jacobs | E04D 1/26 |
| | | | 52/173.3 |
| 2012/0204927 A1* | 8/2012 | Peterson | H02S 20/25 |
| | | | 136/244 |
| 2013/0055664 A1* | 3/2013 | Gombarick, Jr. | H01L 31/0482 |
| | | | 52/173.3 |
| 2013/0111831 A1* | 5/2013 | Jenkins | E04D 13/00 |
| | | | 52/173.3 |
| 2013/0167472 A1 | 7/2013 | Jenkins et al. | |
| 2014/0150843 A1 | 6/2014 | Pearce et al. | |
| 2014/0167513 A1* | 6/2014 | Chang | H02J 3/385 |
| | | | 307/52 |
| 2014/0352760 A1 | 12/2014 | Haynes et al. | |
| 2014/0366464 A1* | 12/2014 | Rodrigues | H02S 40/32 |
| | | | 52/173.3 |
| 2015/0101270 A1* | 4/2015 | Croft | H02S 40/38 |
| | | | 52/173.3 |
| 2015/0179346 A1* | 6/2015 | Lee | H01G 9/0036 |
| | | | 136/244 |
| 2016/0254776 A1* | 9/2016 | Rodrigues | H02S 20/23 |

FOREIGN PATENT DOCUMENTS

| | | |
|---|---|---|
| DE | 202010016394 U1 | 4/2011 |
| DE | 102011105309 A1 | 12/2012 |
| EP | 0 018 543 A1 | 11/1980 |
| JP | H11 303346 A | 11/1999 |
| JP | 2000034813 A | 2/2000 |
| JP | 2001 098703 A | 4/2001 |
| WO | 2008/137966 A2 | 11/2008 |
| WO | 2009/062178 A2 | 5/2009 |

OTHER PUBLICATIONS

International Search Report dated Feb. 6, 2018, for corresponding International Application No. PCT/US2017/058147, filed Oct. 24, 2017, 6 pages.

Written Opinion, dated Feb. 6, 2018, for corresponding International Application No. PCT/US2017/058147, filed Oct. 24, 2017, 10 pages.

* cited by examiner

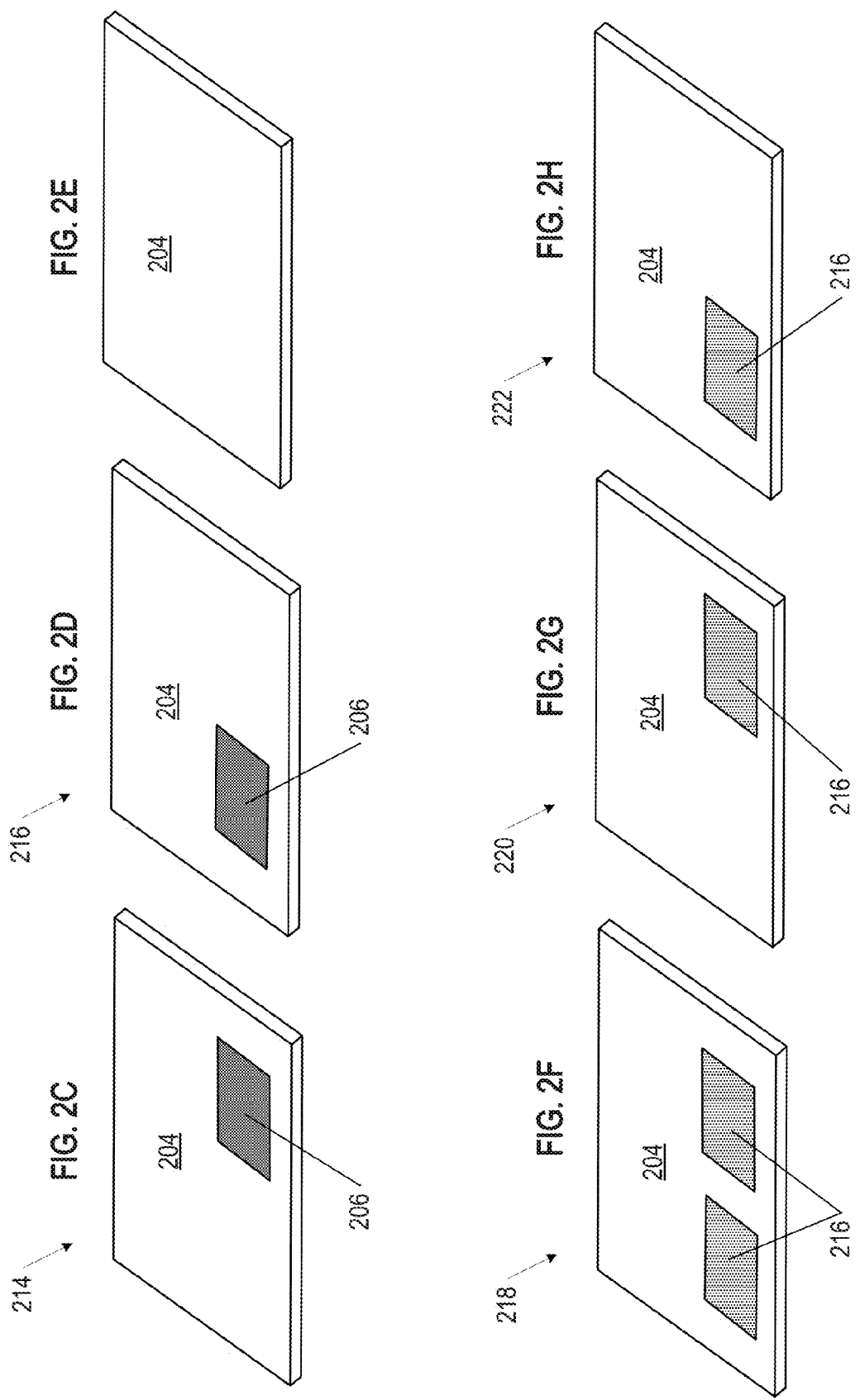

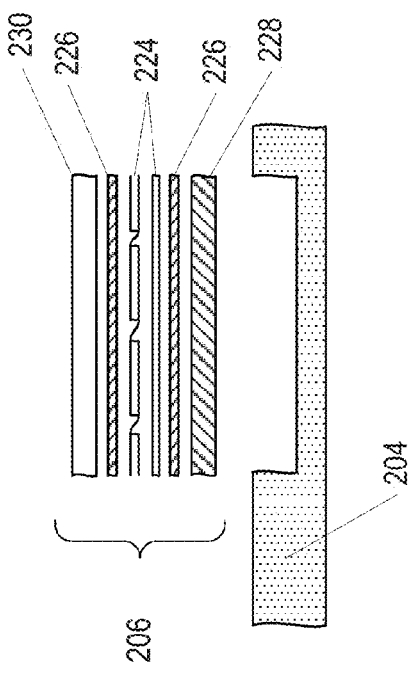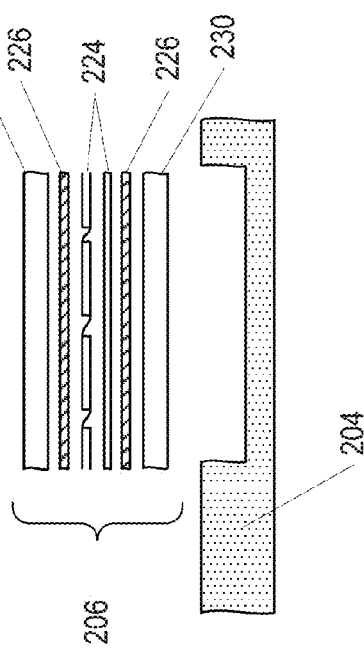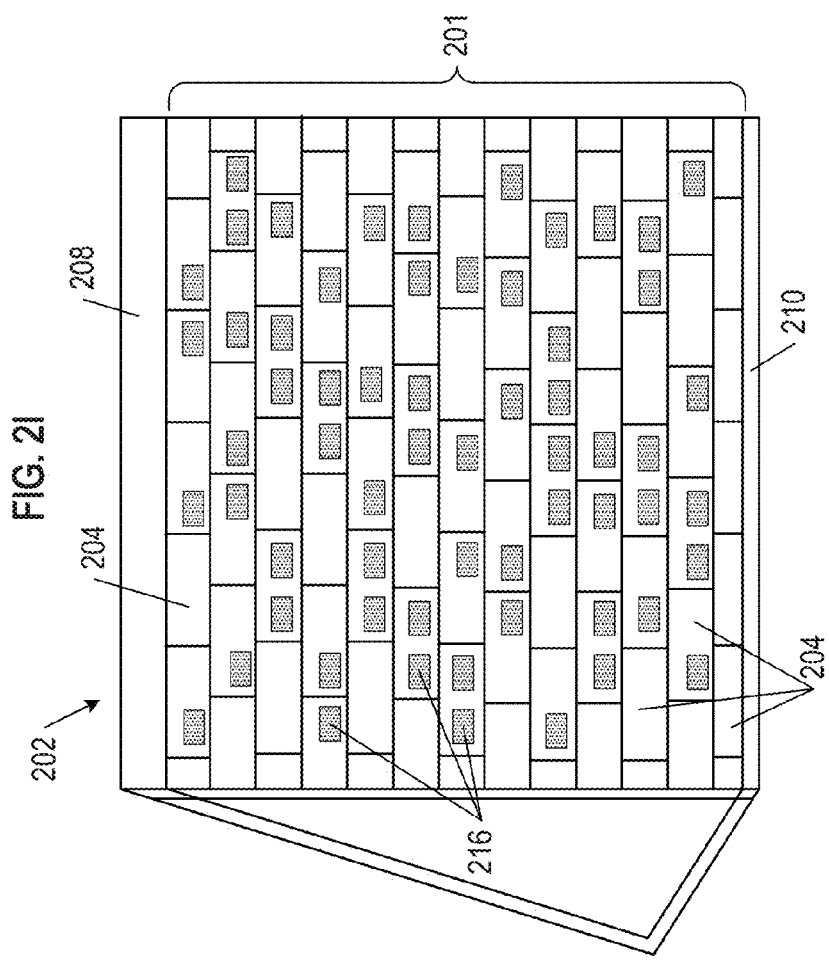

Light Production Layout 4.5W per cell
~1,400 cells
~6,300 kW

Heavy Production Layout 4.5W per cell
~2,800 cells
~12,600 kW

BUILDING INTEGRATED PHOTOVOLTAIC SYSTEM FOR TILE ROOFS

CROSS-REFERENCE TO RELATED APPLICATIONS

This claims the benefit of priority to U.S. Provisional Application No. 62/413,298, entitled "BUILDING INTEGRATED PHOTOVOLTAIC SYSTEM FOR TILE ROOFS" and filed on Oct. 26, 2016, which is herein incorporated by reference in its entirety.

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of utility power in most areas, however, solar largely remains a niche product for those who value saving money, reducing $CO_2$ emissions, or both.

One factor that may limit the adoption of solar technology is aesthetics. Most residential solar systems are installed as modules on an existing tile or composition shingle roof. The solar array, which often only covers a portion of the roof, or even a portion of one mounting plane on the roof, stands out as separate and distinct from the existing roof, both in height and material. This structure is therefore visible even from the street level and over large distances.

Another obstacle to solar adoption in existing homes is the dissonance between the age of the existing roof and the solar system, particularly where the existing roof is made from composition shingles. The expected life of a solar system can be about 25 years, and the expected life of a composition shingle roof is also about 50 years, depending on the local climate and specific tile materials. At the time a customer is considering going solar, their existing roof may be several years, if not decades, into that lifespan. So the customer may be presented with the dilemma of getting a new roof first, increasing the cost of going solar, or installing a 25-year solar system on a roof which may have a relatively shorter remaining operational lifespan.

Accordingly, there is a need to resolve the dissonance between the expected life of the solar system and the remaining life of the roof, that also blends in more aesthetically with the complete roof surface or at least the mounting plane, and that does not require the prospective customer to pay for a new roof and a new solar system over that roof.

BRIEF SUMMARY

Various embodiments provide a new and improved approach to installing solar on existing roofs, and in particular, existing tile roofs. Some aspects fit over an existing tile roof and/or other suitable roof surfaces (e.g., a metal roof, composite shingle, roof deck, underlayment or insulation layer). Some aspects have improved aesthetics that reduce the visual differences between solar and non-solar portions of the roof. Some aspects are more modular and/or simplify the replacement capability of individual photovoltaic modules of the system. In addition, some aspects cost less to make and install compared to conventional solar systems. Further, some arrangements of solar and non-solar portions of the roof, or of photovoltaic and non-photovoltaic portions of modules or roof tiles, can generate a visual pattern and aesthetic that appear irregular, random, or made from traditional roofing materials. Some solar systems can be installed as a new roof rather than a re-roof or mounted to an existing roof. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 2C shows an exemplary photovoltaic tile having one solar cell in the reveal portion of the tile, biased toward the right side of the tile, in accordance with aspects of the disclosure.

FIG. 2D shows an exemplary photovoltaic tile having one solar cell in the reveal portion of the tile, biased toward the left side of the tile, in accordance with aspects of the disclosure.

FIG. 2E shows an exemplary non-photovoltaic tile having no solar cells on the upper surface of the tile, in accordance with aspects of the disclosure.

FIG. 2F shows an exemplary photovoltaic tile having two non-photovoltaic silicon elements in the reveal portion of the tile, in accordance with aspects of the disclosure.

FIG. 2G shows an exemplary photovoltaic tile having one non-photovoltaic silicon element in the reveal portion of the tile, biased toward the right side of the tile, in accordance with aspects of the disclosure.

FIG. 2H shows an exemplary photovoltaic tile having one non-photovoltaic silicon element in the reveal portion of the tile, biased toward the left side of the tile, in accordance with aspects of the disclosure.

FIGS. 2I and 2J show exploded cross-sectional views of solar cells of photovoltaic modules, showing the different layers of the photovoltaic module, in accordance with embodiments of the disclosure.

FIG. 2K shows a schematic of a portion of a building integrated photovoltaic system having non-photovoltaic tiles, in accordance with embodiments of the disclosure.

DETAILED DESCRIPTION

Figure 1A:
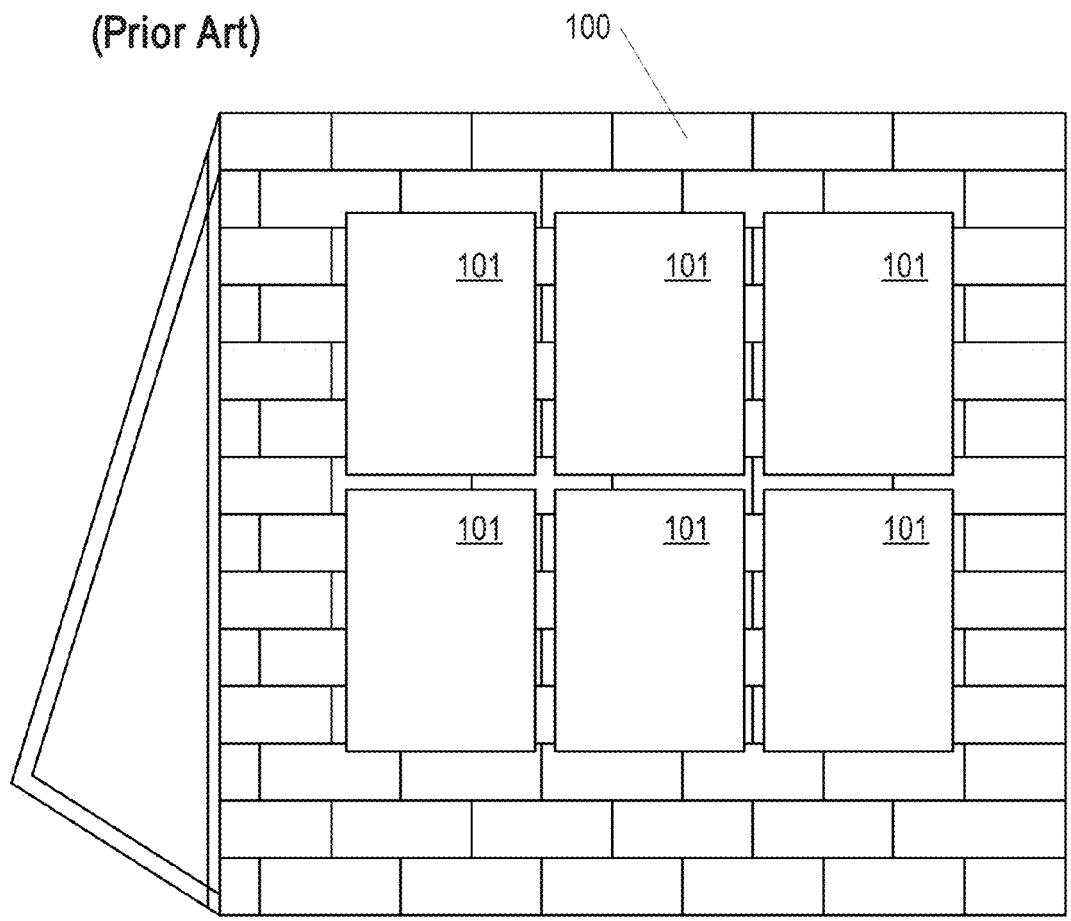
FIG. 1A shows an example of a prior art photovoltaic array installed on a roof.

The present disclosure describes various embodiments of photovoltaic roofing systems and associated systems and methods. Some embodiments relate to building integrated photovoltaic module assemblies and associated systems and methods. In various embodiments, the systems described herein lower costs of conventional systems in which a photovoltaic ("PV") system is installed over a roof, and at the same time can provide an improved aesthetic for a PV roof system, and particularly a building integrated PV system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as the actual building envelope (e.g., roofing membrane), can provide a watertight or substantially watertight seal for the roof surface.

For the sake of distinguishing between structural elements of the present BIPV system, as used herein, the terms "photovoltaic module", "PV module", and "solar cell" refer to the structures of the system with solar energy collecting elements, while the term "PV tile" refers to such solar collecting elements as mounted or adhered to a structural roof tile. Accordingly, as use herein, a "roof tile" refers to a structural element of a roof, which may or may not have PV elements attached thereto, depending on the context of the description.

As used herein, the terms "up-roof" and "down-roof" are used to provide orientation, direction, position, or a reference point relative to or in context of a roof or roofing surface upon which the systems described herein are installed on and/or form a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Rapid shutdown devices ("RSD") for PV systems can be applied to the systems described herein, and can be located or positioned in various locations. In some embodiments, a recess or other opening can be made in structural support pans (e.g. a transition pan or a non-PV pan) through insulation such that RSD can be inset or positioned inside recessed opening. Vents can be positioned on top of opening to conceal or cover opening. Structural support pans can be elements of roofing frames or array systems that provide stability or integrity to the overall structures, as described in further detail below. RSD can be positioned within a box or other suitable container prior to positioning within recess. In other embodiments, RSD can be positioned under eaves, or eave flashings or gutters. In yet other embodiments, RSD can be positioned within attic portions of a building.

Generally, PV modules are crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting tiles. In some embodiments, PV modules can include layers of amorphous silicon or thin film variations of solar energy-collecting laminates, or thin-film solar materials directly applied as continuous sheets. Generally, PV tiles as considered herein, which can include PV modules, solar cells and laminates, have individual structures that can be used in combination to form larger solar arrays and/or building structures, as set forth below. Alternatively, thin-film PV modules, such as cadmium telluride, copper-indium-gallium-diselenide ("CIGS"), or amorphous thin-film silicon may be used. In still further embodiments, cells based on perovskite or other as of yet non-commercialized materials may be used. The particular type of cell technology used for any given installation can be selected both for solar energy collecting functionality and for aesthetic qualities, as related to the present disclosure.

For any given solar panel installation on the roof of a residential, commercial, or industrial building, there is a balance obtained between the power generation of the solar panel array, the visual appearance and aesthetic of the solar panel array, and the structural requirements for mounting or constructing the solar panel array. For BIPV installations as considered herein, the materials for forming the roof and the PV elements for collecting solar radiation are combined into a single unit, where the aesthetic of the solar panel array can be optimized while still maintaining a desired level of power collection and generation. However, not every surface, slope, or region of a roof may be amenable to, or need to be used for, solar energy generation. Thus, BIPV systems can also include "dummy" or "mimic" roof tiles that can include patterning or silicon elements that appear similar to the PV tiles, but do not collect solar radiation and are not electrically connected to a centralized power transformer.

PV elements that are distributed over all roof surfaces can have a visual uniformity that is neat, generally continuous, and elegant. Adjusting the density of PV element on a roof surface changes both the appearance of the overall roof and the energy production of the solar array on the roof, typically measured in kilowatts (kW) or kilowatt-hours (kWh). Accordingly, the density of PV elements can be adjusted to achieve a desired kilowatt-hour production goal while maintaining an even distribution of the PV elements with a consistent visual aesthetic. In some aspects, PV elements can be distributed on the surface of a roof in a randomized, semi-randomized, or non-regular pattern to achieve the aesthetically pleasing neat, generally continuous, and elegant appearance.

In contrast with embodiments of the present disclosure, FIG. 1A shows a prior art PV array installed on roof 100. The exemplary PV array of FIG. 1A includes six solar panels 101 or modules which (though not shown in detail) are mounted on roof 100 using one of various known rail-based or rail-free mounting systems, as are currently employed by solar installers, such as San Mateo, Calif.-based SolarCity Corporation.

Figure 1B:
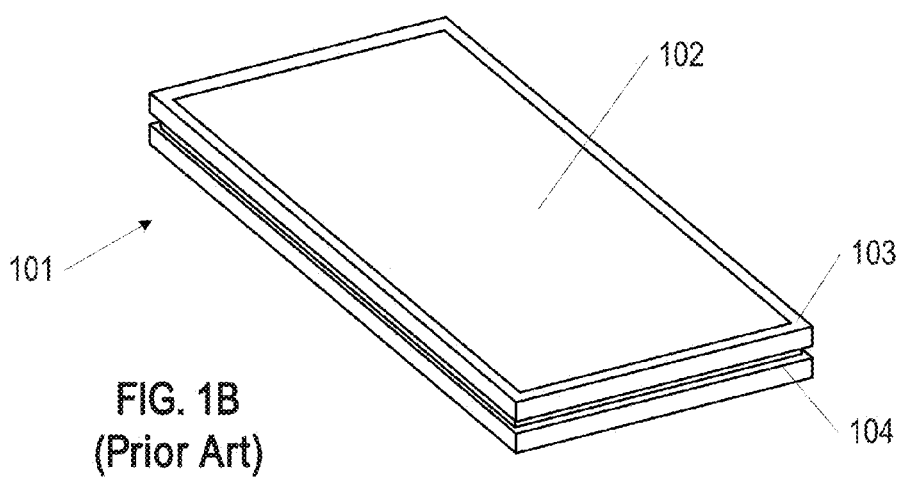
FIG. 1B shows an exemplary prior art photovoltaic module.

FIG. 1B shows one type of conventional solar panel 101 in more detail. Solar panel 101 includes PV laminate 102, which in conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by SolarCity Corporation of San Mateo, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal and have material usage inefficiencies. First, conventional PV systems, such as that shown in FIG. 1A, are typically installed over an existing roof, and not as part of the existing roof, essentially requiring redundant structure since the PV array will shield most of the portion of the roof that it is installed over. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. The metal frame portion can be painted black to help it blend in with the roof surface, or it can simply be raw aluminum. Regardless of whether blue or black modules are used, the difference between the look of the portion of the roof that is covered with solar panels and the remainder of the roof is generally quite dramatic. This contrast can be particularly jarring with a conventional PV system and array mounted on a tile roof. As a result, roofs that are partially covered with solar panels have an aesthetic contrast that can be seen from very far distances due to the difference in reflectivity, elevation, height, and/or color between these two very different surfaces.

Tile Roof Building Integrated Photovoltaic Array

As discussed herein, solar cells that are integrated as part of roof tiles can be connected together as and laid down so that they make up the main surface of a roof, and in particular, a tile roof. By having the PV tiles individually carry solar cells, because the PV tiles are part of the roof, advantages can be obtained in comparison to more traditional "on-roof" arrays that are slightly elevated from the surface of a roof. For example, roof surfaces formed of PV tiles are directly built onto the framing structure of a roof can be lighter than on-roof installations, at least because the built-in BIPV solar array does not require a second structure above an existing roof. Further, a roof that is being replaced in a re-roofing installation can replace older or traditional roof tiles or with PV tiles, which can be more efficient in reducing the amount of materials needed for a re-roofing installation. Also, electrical connections, junction boxes, and wiring can be generally housed underneath PV tiles of BIPV assemblies, protecting such components from precipitation, wind, and excess heat, and further hiding such components from an observer so as to make the overall BIPV system visually attractive or uniform.

BIPV solar arrays generally aspire to provide for an advantage over traditional on-roof PV systems by having a less drastic topological difference, thereby reducing visually noticeable differences in height on regions of the roof. However, previous implementations of BIPV systems do not necessarily provide for further visual qualities or design that effectively minimize noticeable differences between solar materials and standard roofing materials that form the overall PV system. Embodiments of the present disclosure provide for a BIPV system, with solar cells applied onto individual roofing tiles and electrically connected in strings or other circuits, which is visually appealing at least in that the solar elements and roofing materials are combined and assembled in a layout that minimizes or camouflages the differences between the solar components and the standard construction materials.

A part of the advantage of the present system is that the process of laying a tile roof is straightforward, where accounting for PV elements on tiles, and making electrical connections between the solar cells on tiles, requires only minimal additional work and training. A BIPV tile roof as considered herein is mounted in generally the same manner as a standard tile roof, for example: securing and sealing underlayment or other sheathing to frame elements of the roof, adding battens as needed to portions of the roof frame, installing tiles to form the main surface of the roof, working around obstacles (e.g., chimneys, skylights, vents, etc.) as needed, and installing ridge and edge tiles in combination with flashing or other trim structures of the roof. In the present system, the roof tiles must have a structural integrity capable of accommodating and supporting PV elements on the tiles, in terms of weight, heat generated, ability to connect electronics, and retaining strength to serve as a portion of a roof surface. The tiles used can be of standard sizes as known in the industry. Further, tiles used for systems considered herein can have a wide range of colors to match or blend with PV elements, including, but not limited to, blue, blacks, grays, browns, and natural clay colorations.

Figure 2A:
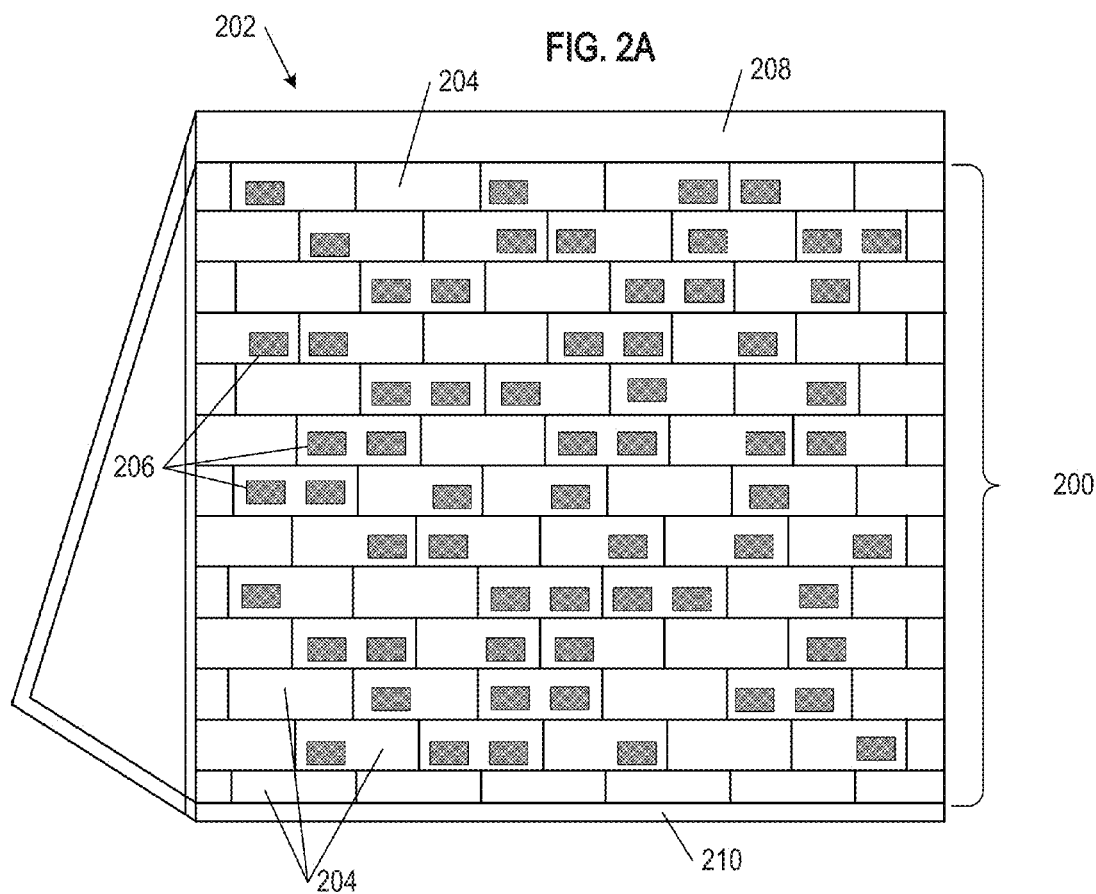
FIG. 2A shows a schematic of a portion of a building integrated photovoltaic system having photovoltaic tiles, in accordance with embodiments of the disclosure.

FIG. 2A shows exemplary BIPV system 200 installed in a plane as part of roof surface 202. BIPV system 200 is arranged from roof tiles 204 in horizontal rows or courses along the length of roof surface 202. Vertically adjacent courses of roof tiles 204 are offset from each other by about half the width of each roof tile 204, such that seams or breaks between two vertically adjacent rows of roof tiles 204 do not form a single seam or break along the full slope of roof surface 202, but rather form an alternating pattern of seams, where breaks between adjacent roof tiles 204 are relatively equidistant from each other. Roof surface 202 further includes ridge flashing 208 at the top of roof surface 202 and eave flashing 210 at the bottom of roof surface 202.

Several different types of roof tiles 204 can be used for roof surfaces 202 as considered herein. Roof tiles 204 can be made of materials including, but not limited to: stone, quartz, slate, granite, ceramics, concrete, porcelain, rigid shingle, clay, glass, onyx, or replica materials for the same. Roof tiles 204 can have shapes including, but not limited to: rectangular, square, club, step, bullnose, fishtail, arrow, curved, or irregular. Roof tiles 204 having one side longer than another side can be oriented either with the longer edge of roof tile 204 generally parallel to the width dimension roof surface 202 or with the shorter edge of roof tile 204 generally parallel to the width dimension roof surface 202. Generally, roof tiles 204 considered for use herein are flat tiles for forming roofing structures, but in other embodiments roof tiles can include, but are not limited to: curved tiles, barrel tiles, s-shaped tiles, Spanish tiles, tiles shaped to be used on the edges of a roof, or tiles shaped to interlock with adjacent tiles. In further alternative embodiments, roof tiles can be stamped tiles, having a size and weight similar to roof shingles, which can have a striated or contoured top surface, where the top surface can be formed of glass. All roof tiles 204 considered herein can have be formed with lapping tabs or features extending past the perimeter of the top surface, or without excess trim or material extending from a bottom plane or surface of roof tile 204.

Figure 2B:
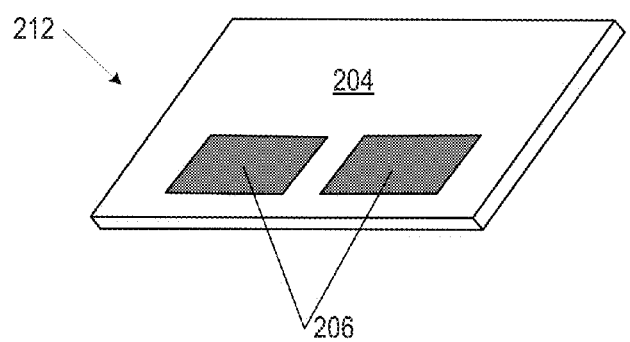
FIG. 2B shows an exemplary photovoltaic tile having two solar cells in the reveal portion of the tile, in accordance with aspects of the disclosure.

Each roof tile 204 as shown in BIPV system 200 can have one solar cell 206, two solar cells 206, or no solar cells on the upper surface of roof tile 204. FIG. 2B shows roof tile 204 having two solar cells 206 in the reveal portion of the tile, effectively spanning the complete width of roof tile 204, which can be referred to as full PV tile 212. FIG. 2C shows roof tile 204 having one solar cell 206 in the reveal portion of the tile, biased toward the right side of roof tile 204, which can be referred to as right-half PV tile 214. FIG. 2D shows roof tile 204 having one solar cell 206 in the reveal portion of the tile, biased toward the left side of roof tile 204, which can be referred to as left-half PV tile 216. FIG. 2E shows non-photovoltaic roof tile 204 having no solar cells on the upper surface of roof tile 204, and can be referred to as a non-photovoltaic, blank, or simply roof tile 204. It can be appreciated that while right-half PV tiles 214 and left-half PV tiles 216 components of BIPV system 200 refer to "halves" of PV tiles, each individual solar cell 206 in fact covers about one-quarter or less of a top surface of roof tile 204 in the reveal portion of roof tile 204. Generally, an upper portion of the top surface of roof tile 204 in BIPV system is a "lapped" or "overlap" region and, as part of a roofing installation, will be physically covered or underneath bottom surfaces of roof tiles 204 of the next adjacent, up-roof row of roof tiles 204.

Solar cells 206, embedded or adhered to roof tiles 204, can be frameless or have a minimized frame structure. Practically, for PV tiles, roof tiles 204 are both the structural substrate and frame for solar cells 206. In some aspects, solar cells 206 can have electrical contacts in a frame section, but this is optional. In other words, solar cells 206 can be constructed without a rigid frame (e.g., made of metal, plastic) surrounding or enclosing the edges of the PV material, or in some embodiments, surrounding only a portion of the bottom and sides but not the top of solar cell 206.

Accordingly, BIPV system 200 shown in FIG. 2A includes a mixture of full PV tiles 212, right-half PV tiles 214, left-half PV tiles 216, and blank roof tiles 204. Unlike on-roof mounted PV arrays or other BIPV systems where only some regions of a roof surface are covered with photovoltaic elements, the set of full PV tiles 212, right-half PV tiles 214, left-half PV tiles 216, and blank roof tiles 204 completely form a structural envelope for roof surface 202. Further, viewed together, these PV tiles and blank tiles form BIPV system 200 that reduces the redundancy inherent in conventional PV systems while providing a uniform look and appearance. BIPV system 200 achieves a combined function of forming structurally sound roof surface 202 as well as a solar energy collecting circuit.

The particular PV tiles chosen for any given BIPV system 200 layout can be generally randomized, or semi-randomized, while accounting for unique structural limitations of roof surface 202 for specific installations. For sections or regions of roof surface 202 that require cutting or trimming to fit around obstacles or elements in roof surface 202, or to form edges of roof surface, blank roof tiles 204 can be cut for fitting around obstacles or contours. The randomized or semi-randomized assortment of PV tiles and blank roof tiles 204 can thus allocate solar cells 206, via the underlying PV tiles, to sections of roof surface 202 that do not have obstacles, sections that do not form upper, lower, lateral, or other edges and sides of roof surface 202.

Other aspects of roof surface 202 can interface with BIPV system 200 to form a satisfactory roof. For example, ridge flashing 208 can include a ridge cap at the top of the resultant BIPV array, and may be used for venting, heat dissipation, wire management, and to generally conceal and protect wires (e.g., conduits or cables) or other equipment (e.g., fans, vents, connectors, inverters, jumpers, home-run connections). Waterproofing components, such as liners or trim, can be set underneath or between PV tiles such that roof surface 202 properly functions as a roof to prevent water from entering the structure of the building. BIPV system 200 can also include other roofing components (e.g., flashings, gutters, vents, caps, covers, trims), for example, at eave flashing 210, hips, valleys, or sides of the roof (not shown).

Roof tiles 204, both PV tiles and non-photovoltaic tiles, can mounted as part of roof surface 202 with other structural components to form a roof envelope of a building. Moreover, as discussed in greater detail herein, PV tiles supporting or embedded with solar cells 206 can be specifically configured to accommodate electrical junction boxes or micro-inverters on each individual PV tile, located on the bottom surface (underside) of relevant roof tiles 204. Wiring, cables, and/or power buses to electrically connect PV tiles, and by extension solar cells 206 on PV tiles, can string together a plurality of PV tiles. To avoid physical conflicts with underlying studs, rafters, joints, battens, buttresses, or other infrastructure of a roof, such electrical components can be attached to the underside of PV tiles in locations to avoid physical conflicts. In combination or alternatively, blank roof tiles 204 that do not include electrical connectors or components can be used where such that there is no structure on the underside of blank roof tiles 204 that would otherwise physically conflict with underlying roof infrastructure.

A string of PV tiles can be electrically connected together as a subset circuit of roof surface 202 to have a specific or desired number of solar cells as part of the subset. Such subset circuits can have a specific number of solar cells to build to a desired voltage or kilowatt production. For example, a subset circuit of electrically connected PV tiles can have four (4) solar cells, six (6) solar cells 206, eight (8) solar cells 206, ten (10) solar cells 206, twelve (12) solar cells 206, or any number of solar cells 206 within or around that numerical range. By extension, subset circuits can alternatively have more solar cells 206 to build to higher voltage and kilowatt levels, for example having 20-cell, 24-cell, 30-cell, 36-cell, 40-cell, 42-cell, 48-cell, 54-cell, 56-cell, 60-cell, 70-cell, 80-cell, or 92-cell embodiments. Further embodiments can have PV tiles with other number-of-solar-cell embodiments above, below, or within the above-considered increments. The various embodiments of strings with different numbers of solar cells allows for flexibility in selecting solar panels appropriate for any given system installation.

FIG. 2F shows roof tile 204 having two silicon elements 216 in the reveal portion of the tile, which can be referred to as full PV mimic tile 218. In an installation, full PV mimic tile 218 will have effectively the same appearance as full PV tile 212 shown in FIG. 2B. FIG. 2G shows roof tile 204 having one silicon element 216 in the reveal portion of the tile, biased toward the right side of roof tile 204, which can be referred to as right-half PV mimic tile 220. In an installation, right-half PV mimic tile 220 will have effectively the same appearance as right-half PV tile 214 shown in FIG. 2C. FIG. 2H shows roof tile 204 having one silicon element 216 in the reveal portion of the tile, biased toward the left side of roof tile 204, which can be referred to as left-half PV mimic tile 222. In an installation, left-half PV mimic tile 222 will have effectively the same appearance as left-half PV tile 216 shown in FIG. 2D. In some contexts, full PV mimic tile 218, right-half PV mimic tile 220, or left-half PV mimic tile 222 can be collectively referred to as dummy tiles. Further, as none of full PV mimic tile 218, right-half PV mimic tile 220, left-half PV mimic tile 222, and blank roof tiles 204 include any photovoltaic elements, in aggregate these can be referred to as non-photovoltaic roof tiles.

FIG. 2I shows a schematic of non-production region 201 of a BIPV 200 system using non-photovoltaic tiles, particularly full PV mimic tiles 218, right-half PV mimic tiles 220, left-half PV mimics tile 222, and blank roof tiles 204. The pattern and arrangement of the non-photovoltaic tiles, is similar to the PV tiles as seen in FIG. 2A, with roof tiles 204 in horizontal rows or courses along the length of roof surface 202. Vertically adjacent courses of non-PV tiles are offset from each other by about half the width of each roof tile 204, such that seams or breaks between two vertically adjacent rows of non-PV tiles do not form a single seam or break along the full slope of roof surface 202, but rather form an alternating pattern of seams, where breaks between adjacent roof tiles 204 are relatively equidistant from each other. Again, roof surface 202 further includes ridge flashing 208 at the top of roof surface 202 and eave flashing 210 at the bottom of roof surface 202.

Accordingly, BIPV system 200 can be constructed using seven (7) stock keeping units (SKUs): full PV tiles 212, right-half PV tiles 214, left-half PV tiles 216, blank roof tiles 204, full PV mimic tiles 218, right-half PV mimic tiles 220, and left-half PV mimic tiles 222. While there can be seven SKUs, only four of the seven types of tiles will be needed for any given section of an installation, depending on whether the section of BIPV system 200 is desired to be an energy collecting region or non-production region 201. For example, on a given building, the South face of a roof may receive the most incident solar energy, while the North face of the roof of the building may not receive sufficient sunlight to be worth having PV tiles. To optimize the use of PV elements, full PV tiles 212, left-half PV tiles 216, right-half PV tiles 214, and blank tiles 204 can be laid on the South face of roof surface in a randomized arrangement, while full PV mimic tiles 218, left-half PV mimic tiles 222, right-half PV mimic tiles 220, and blank roof tiles 204 can be placed also in a randomized arrangement on the North face of roof surface. Thus, both the South and North sides of roof surface 202 can appear similar, while having slightly different functional effects, e.g. both solar collection and an attractive aesthetic appearance versus only an attractive aesthetic appearance, respectively.

For some roof surfaces 202, regions of roof surface may be occluded from consistent incident sunlight (e.g. due to shade from a tree), and accordingly, an occluded portion of roof surface 202 can be laid with dummy, mimic PV tiles, in order to avoid wasting energy collecting PV tiles in that occluded portion of roof surface. It can be understood that BIPV system 200 maximizes the amount of solar energy collected where full PV tiles 212, right-half PV tiles 214, and left-half PV tiles 216 are located in portions of roof surface 202 that receive a significant amount of incident solar energy, being, for example, on a portion of roof surface 202 that receives sunlight from about 8 to about 16 hours a day, regardless of the azimuth position of the sun relative to that portion of the roof surface. In other words, full PV tiles 212, right-half PV tiles 214, and left-half PV tiles 216 can be placed where solar cells 206 can collect sufficient solar energy to meet the designed or desired energy production goal of BIPV system. Conversely, full PV mimic tiles 218, right-half PV mimic tiles 220, and left-half PV mimic tiles 222 can be used on portions of roof surface 202 that do not receive enough incident solar energy to merit use of PV tiles, for example a portion of roof surface 202 that receives incident solar energy for less than about 8 hours per day, or where use of PV tiles would be relatively inefficient and a greater cost than benefit for BIPV system 200.

The combination of these elements above for BIPV system 200, both in PV tiles and non-PV tiles, can provide for an overall roof appearance that is visually pleasing, with minimal points of contrast or sharp edges to distract the eye of an observer. The clear aesthetic advantage includes the fact that roof surface 202 does not look choppy or discontinuous, with distinctive PV sections and non-PV sections.

In some aspects, PV tiles and non-PV tiles can be deployed or arranged on a roof surface at the same density, which can thereby minimize points of distinction between different types of roof tiles. In further aspects, PV tiles and non-PV tiles can be deployed or arranged on a roof surface in a non-regular pattern, either at an equal density of PV tiles and non-PV tiles or at a density biased toward either more PV tiles or more non-PV tiles. In other words, production layouts of PV tiles and non-PV tiles can be set and arranged at a desired density for any given installation of a solar roof surface.

FIGS. 2J and 2K show exploded cross-sectional views of exemplary solar cells 206, showing in further detail layers of solar cells 206 used, for example, in FIGS. 2B, 2C, and 2D. In some embodiments, solar cells 206 described herein refer to crystalline-type solar modules. However, solar cells 206 are not limited to crystalline-type solar cell technology. For example, in other embodiments, thin-film or amorphous solar (e.g., amorphous silicon) can be used as laminate layers with certain embodiments of solar cells 206 described herein. In yet further embodiments, hybrid crystalline and amorphous solar modules can be used with solar cells 206 systems described herein. In other embodiments, other types of solar cells (e.g., non-silicon based semiconductors, partial silicon, non-crystalline, partial crystalline, organic, carbon-based, perovskite, cadmium-telluride, CIGS, dye sensitized, transparent luminescent solar concentrator, polymer, transparent cells) can be provided as part of solar cells 206. Both FIGS. 2J and 2K show solar cell 206 in exploded cross-section above roof tile 204, however, it is understood that solar cell 206 forms a single unit with roof tile 204, by being embedded within, adhered to, integrated with, closely mounted on, or otherwise secured to the upper surface of roof tile 204.

As shown in FIG. 2J and noted above, in some embodiments, solar cells 206 can include PV layers 224 (e.g., solar cells, semiconductor layers, bussing, insulation, laminate) sandwiched between encapsulation layers 226 (e.g., ethylene-vinyl acetate). Solar cells 206 can further include one or more backsheets 228 (e.g., polyvinyl fluoride film) and/or glass layers 230. As shown in FIG. 2K, solar cells 206 can include first and second glass layers 230 (e.g., "glass on glass") sandwiching encapsulation layers 226. The glass on glass solar cells 230 can also eliminate or reduce the need for additional intermediate material layers (e.g., underlayment, felt paper) between a bottom of solar cell 206 and tile roofing material, which may otherwise be used for fire protection or other purposes. In certain embodiments, solar cells 206 can include both glass layer 230 and one or more backsheet layers 228.

Although backsheet layers 228 can have a light color, such as white, solar cells 206 can include non-white (e.g., black, blue, transparent) backsheet layers 228. Non-white backsheet layers 228 can improve aesthetics by reducing glare or reflection off or through glass layers 230 or underlying roof tile 204 as compared to white backsheet layers 228. Additionally, black or blue backsheets tend to be closer in color to conventional solar cells or PV modules. Thus, non-white backsheets can create a more uniform appearance with the rest of the system. Backsheet layers 228 (or other layers) may be cut at an angle, such that the cut, exposed portion of backsheet layer 228 faces an underlying roof 202 or roof tile 204, or is oriented in a substantially downward direction (e.g., toward the roof tile) when solar cells are assembled, embedded in, or adhered to a surface of roof tile 204.

The arrangement of backsheet layers 228 above or below PV layers 224 and encapsulation layers 226 can provide for added thermal control and/or directed light reflection within solar cells 206. In some embodiments, solar cells 206 may include first and second backsheet layers 228 (e.g., non-white or white) sandwiching encapsulation layers 226 (e.g., on both air and cell sides of PV module stack). Further, backsheet layers 228 can be integrated with encapsulation layers 226 or adhesive layers in certain embodiments. Certain backsheets 228 can also provide solar cells 206 with improved thermal dissipation or heat reflective properties, electrical insulation, or protection from damage, moisture, or UV degradation. Such backsheets can include dyMat™, DuraShield®, or PowerShield®.

It should be understood that in these embodiments, roof pitches where such systems are installed are non-zero, and that the systems are installed to account for the angle or slope of (non-flat) roofs. The distances or gaps between various tiles, rows, courses, or assemblies thereof, and the degree to which such gaps are concealed will be dependent on roof pitch, the distance a viewer is from the roof, and the height of the viewer.

Figure 3:
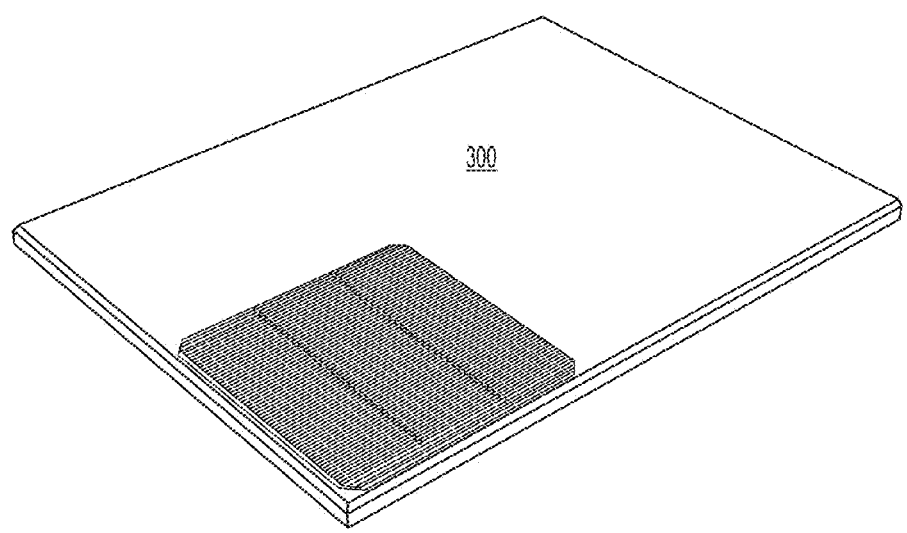
FIG. 3 shows a perspective view of a photovoltaic tile, having a solar cell on the left side of the reveal region, in accordance with embodiments of the disclosure.

FIG. 3 shows a perspective view of PV tile 300, having a solar cell on the left side of PV tile 300 reveal region. The solar cell is located in the portion of PV tile 300 that will be the, relatively down-roof, reveal region, because when laid down with other roof tiles to form a roofing system, the, relatively up-roof, lapping region, of the roof tile will be covered by a roof tile from the next vertically adjacent row of roof tiles. For any individual roof tile, the lower/down-roof portion can be referred to as the "reveal". It is understood that other PV tiles can have the solar cell located in the left-half, down-roof region of the supporting roof tile, while yet other PV tiles can have solar cells across the full span (right and left halves) of the underlying, supporting roof tile. PV tile 300 shows a version of tiles for BIPV systems as considered herein where the solar cell(s) of PV tile 300 is located along the longer length dimension (e.g. the long edge) of PV tile 300; accordingly, both the reveal portion and lapped portion of PV tile 300 also track long the longer length dimension of PV tile 300. It can be appreciated that a non-PV, mimic or dummy tile can have an identical, or near-identical appearance to PV tile 300, with a structure similar to solar cells in the same respective location of the roof tile.

The size of a solar cell in the reveal portion of PV tile 300 can leave a buffer region and distance around each solar cell. In some aspects, a buffer distance of about five millimeters (5 mm) can be present around each solar cell. The buffer zone can provide for a region where an operator can handle PV tile 300 without touching solar cells on the upper surface of PV tile 300. The buffer zone between two solar cells on the same PV tile 300 can be from between about five to about ten millimeters (5-10 mm), or greater, depending on the underlying roof tile used. In further aspects, solar cells can be positioned on PV tile 300 at a position within the reveal region that is a sufficient distance away from the portion of PV tile 300 that will be overlapped by an adjacent up-roof row, to thereby avoid shading concerns.

Figure 4:
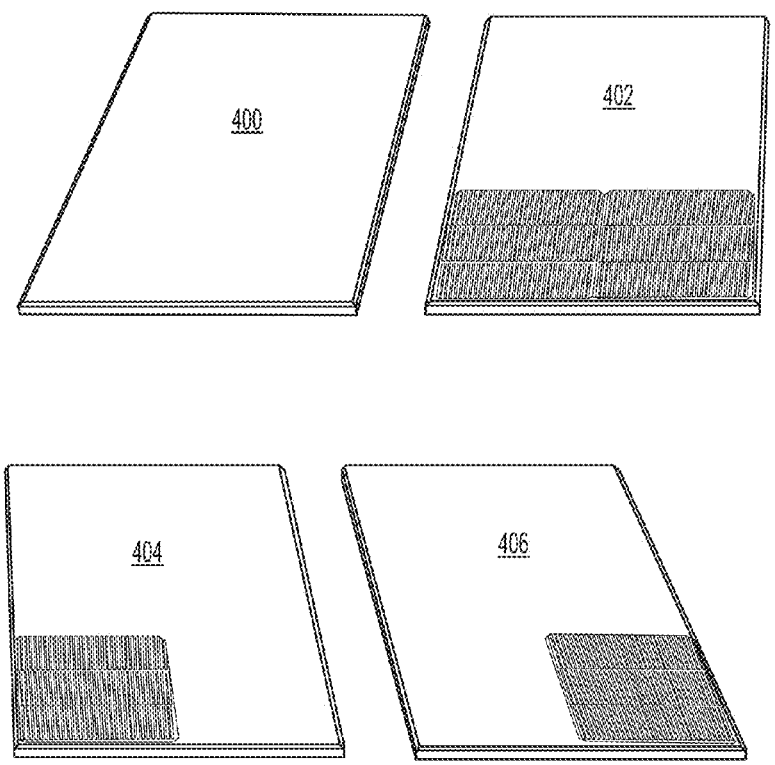
FIG. 4 shows an exemplary set of roof tiles including one non-photovoltaic tile and three photovoltaic tiles with solar cells in portions of the reveal region, in accordance with embodiments of the disclosure.

FIG. 4 shows an exemplary set of roof tiles including one non-photovoltaic tile and three photovoltaic tiles with solar cells in portions of the reveal region. Specifically shown are blank tile 400, full PV tile 402, left-half PV tile 404, and right-half PV tile 406. Full PV tile 402, left-half PV tile 404, and right-half PV tile 406 shown versions of tiles for BIPV systems as considered herein where the solar cells of full PV tile 402, left-half PV tile 404, and right-half PV tile 406 are located along the shorter length dimension (e.g. the short edge) of each respective PV tile. Accordingly, both the reveal portion and lapped portion in each of full PV tile 402, left-half PV tile 404, and right-half PV tile 406 also track long the shorter length dimension of these PV tiles. It can be appreciated that non-PV, mimic or dummy tiles can have an identical, or near-identical appearance to each of full PV tile 402, left-half PV tile 404, and right-half PV tile 406, with structures similar to solar cells in the same respective locations of the roof tiles.

Figure 5:
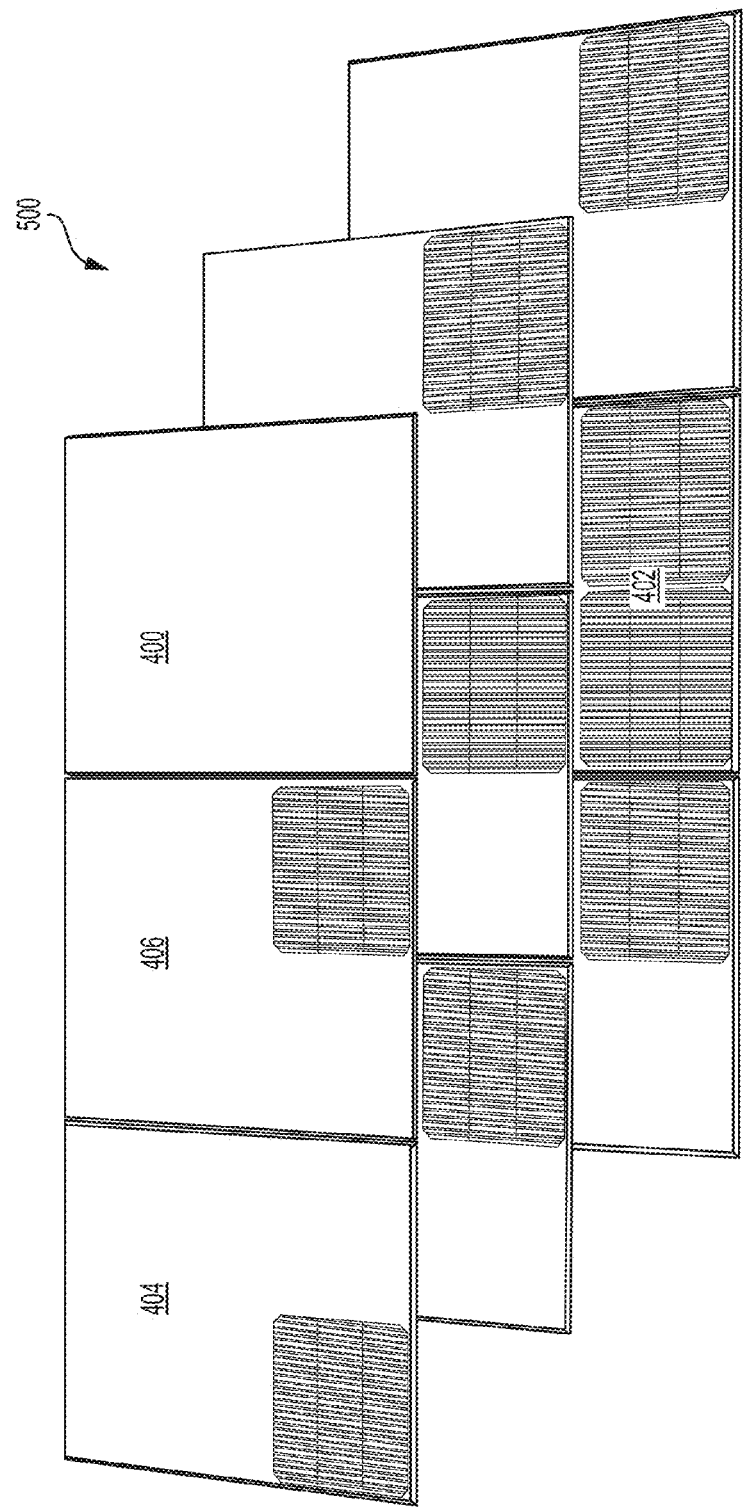
FIG. 5 shows a set of roof tiles in three overlapping courses, including both non-photovoltaic and photovoltaic tiles, in accordance with embodiments of the disclosure.

FIG. 5 shows an exemplary set of PV tiles from FIG. 4 in three overlapping courses 500, including both non-photovoltaic and photovoltaic tiles, in an exemplary arrangement for a BIPV roofing system. The top course of overlapping courses 500 includes (from left to right) left-half PV tile 404, right-half PV tile 406, and blank tile 400. The bottom course of overlapping courses 500 includes full PV tile 402 in the center of the three PV tiles, while the remainder of PV tiles in overlapping courses 500 happen to be right-half PV tiles 406. Again, it can be understood that non-PV, mimic or dummy tiles, can have an identical or near-identical appearance as these PV tiles, and thereby have a similar overall appearance when arranged as overlapping courses 500.

Figure 6:
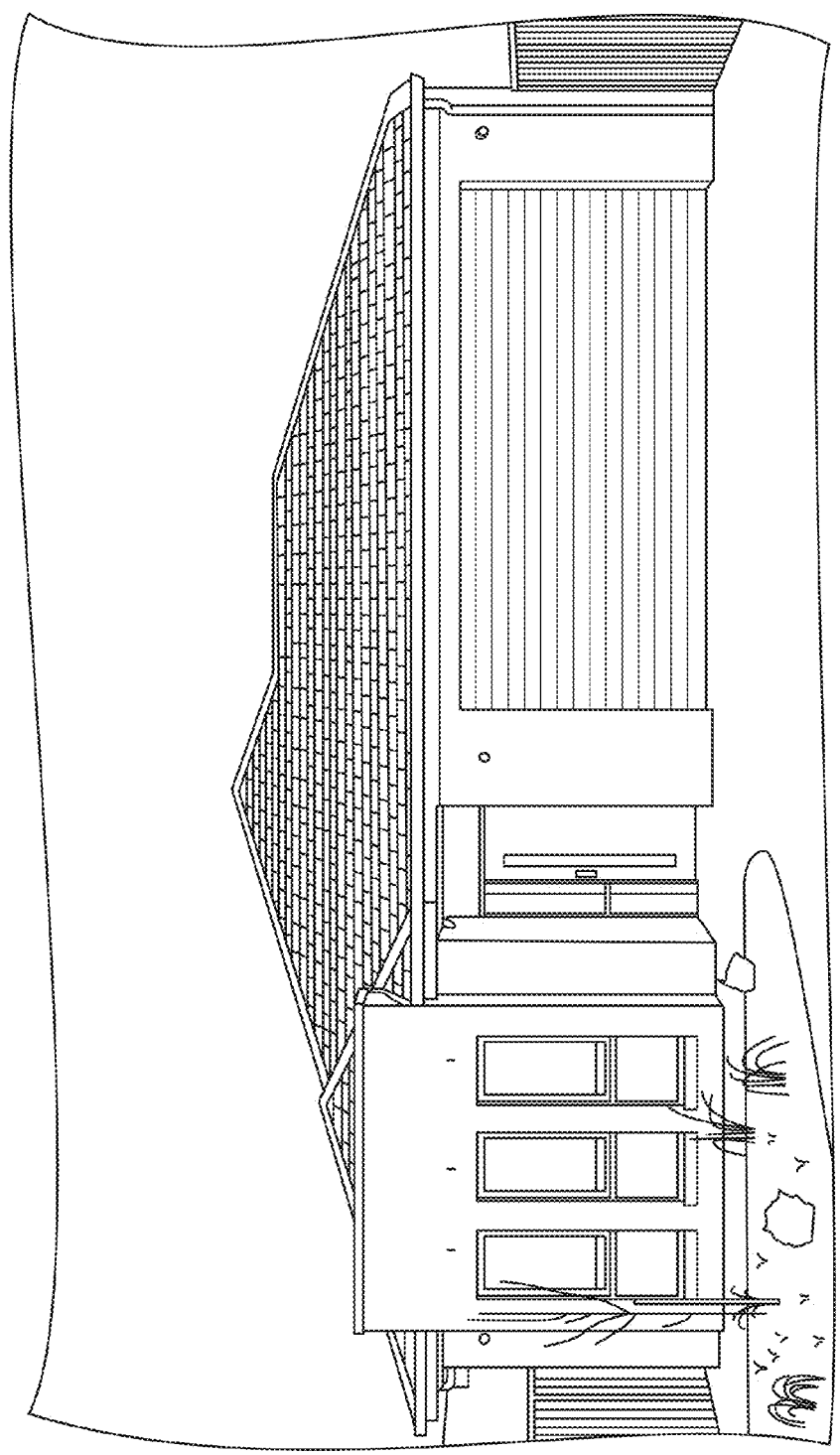
FIG. 6 shows an exemplary residential building having a roof constructed from both non-photovoltaic and photovoltaic tiles and having an aesthetically pleasing appearance, in accordance with embodiments of the disclosure.

FIG. 6 shows an exemplary residential building having a roof constructed from both non-photovoltaic and photovoltaic tiles and having an aesthetically pleasing appearance. The subtle and elegant distribution of PV elements across the roof surface is intentionally similar to and near indistinguishable from a standard tile roof. The attractive implementation of solar cells as construction elements of a roof surface addresses a generally unmet and underserved need in the field, in that the appearance of the PV tile roof surpasses the quality and other attempts at visual integration of many other BIPV systems.

Figure 7A:
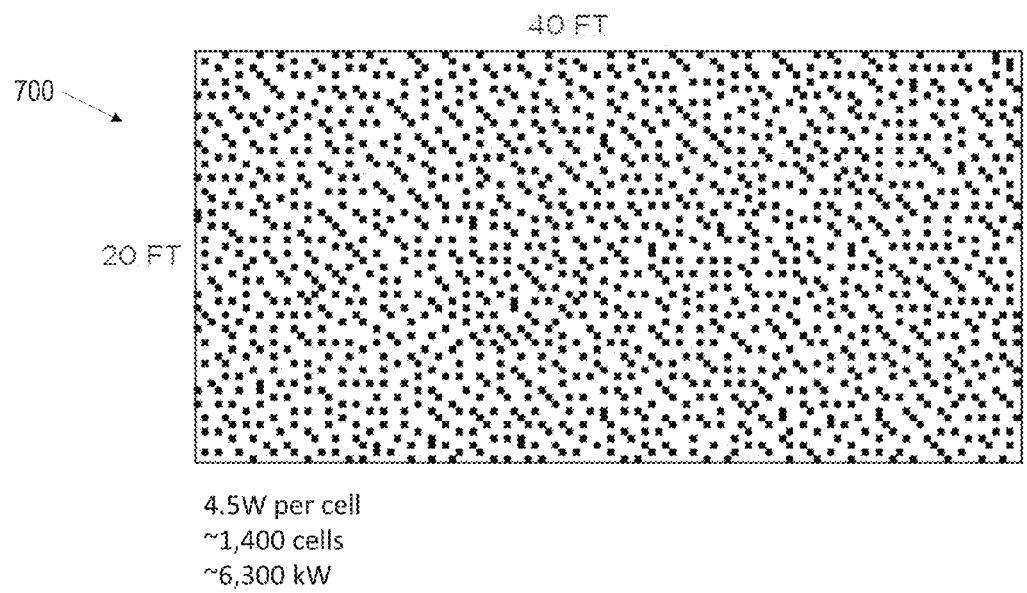
FIG. 7A shows a schematic illustration of solar cell density on a roof surface formed from photovoltaic tiles, having a relatively light energy production layout, in accordance with embodiments of the disclosure.
Figure 7B:
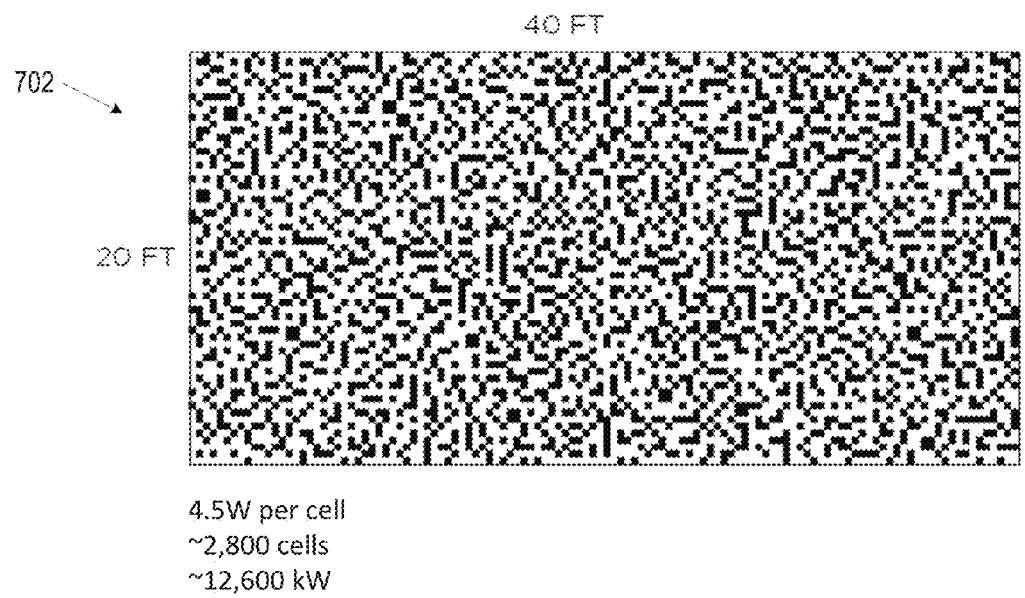
FIG. 7B shows a schematic illustration of solar cell density on a roof surface formed from photovoltaic tiles, having a relatively heavy energy production layout, in accordance with embodiments of the disclosure.

FIG. 7A shows a schematic illustration of solar cell density on a roof surface formed from photovoltaic tiles, having a relatively light energy production layout. In particular, light production layout 700 is an exemplary embodiment of a roof surface forty feet (40 ft.) in length and twenty feet (20 ft.) in height covered with about 1,400 solar cells, each producing 4.5 W per solar cell, for an energy production load of 6,300 kW. FIG. 7B shows a schematic illustration of solar cell density on a roof surface formed from photovoltaic tiles, having a relatively heavy energy production layout. In particular, heavy production layout 702 is an exemplary embodiment of a roof surface forty feet (40 ft.) in length and twenty feet (20 ft.) in height covered with about 2,800 solar cells, each producing 4.5 W per solar cell, for an energy production load of about 12,600 kW.

In both light production layout 700 and heavy production layout 702, blank tiles can be distributed throughout the section of the roof to control density of PV elements. Such blank tiles can also be used around obstructions and roof edges by cutting blank tiles as required to accommodate other structures on the roof. Further, blank tiles can be used and cut-as-needed at the edges, ridges, and eaves of a roof to define the boundaries of the roofing installation. The density of PV elements and solar cells on a roof surface can also be controlled for by installing a calculated or determined number of full PV tiles and half PV tiles in combination with (or alternatively to) and blank tiles. A specific density of PV elements or solar cells on a roof surface can be adjusted to obtain a desired Kilowatt-hour (kWh) production goal, while still having a visual uniformity. Moreover, randomized or semi-randomized placement of PV tiles on a roof surface will lead to a generally even distribution of PV elements, thus providing for both an even aesthetic appearance of the roof and an even amount of solar energy collection from the roof.

It can be appreciated that the terms and scale of light production layout 700 and heavy production layout 702 as shown in FIGS. 7A and 7B are relative to each other, with heavy production layout 702 simply having double the solar cell density of light production layout 700. The range of PV tile layouts and energy production can vary depending on the individual requirements of any given roof or installation location and the ranges for the number of solar cells on a roof surface can scale up or down in density—where the more blank tiles (or dummy tiles) there are relative to PV tiles, or the more half-PV tiles there are relative to full PV tiles, the lower the power collected and produced by the roof.

Indeed, the exemplary embodiments of FIG. 7A and FIG. 7B should not be considered limiting or exclusive, as various combinations, arrangements, and configurations of various PV tiles and non-PV tiles can provide for a wide range of production loads. In some implementations, a roofing system can have a production layout that generates an energy production load from about 3,000 kW to about 12,600 kW. In other implementations, a roofing system can have a production layout that generates an energy production load from about 1,000 kW to about 20,000 kW, or an energy production load bounded at any increment, gradient, or range therein.

Various layouts of solar cells can be implemented in any given BIPV system installation, with the density of solar cells on the roof determined to build to desired voltages or power outputs. For example, a BIPV system having a low-density of solar cells can have a sufficient number of solar cells to build up to an electrically connected string of PV elements producing around fifty volts (50 V) of electric potential. In another embodiment, a BIPV system having a low-density of solar cells can have a sufficient number of solar cells to build up to an electrically connected string of PV elements producing around eighty volts (80 V) of electric potential. Alternative embodiments of a low-density configuration BIPV system can produce from about 50 V to about 80 V of electric potential, or a voltage at any gradient or increment of voltage within that range.

Conversely, high-density configurations of BIPV systems can have the surface area of the relevant roof section be saturated with solar cells to a point where about 70%-80% of the roof section is covered with solar cells or other PV elements. Even with such high-density implementations, the section of roof surface can be filled with solar cells to the point where the roof maintains an aesthetic such that the appearance is natural, and not discontinuous or off-putting.

Determining the appropriate or desired density of solar cells on a roof surface is driven by three factors: (1) the geometry of the roof plane, (2) the desired or necessary kilowatt (kW) power output for the roof surface, and (3) the visual aesthetic of the roof. Determining the appropriate solar cell density for any given BIPV system, balancing both aesthetic and power generation requirements, can be considered to be a balancing of two ratios, which can be independently varied. The first is the ratio of tile-to-silicon for a given roof area and the second is the ratio of PV-to-non-PV for a given roof area.

In some embodiments, the arrangement of the solar cells and PV tiles in a BIPV system can be allocated or designed manually to appear randomized and generally uniform to the human eye. In other embodiments, the arrangement of solar cells in a BIPV system can be determined by a computer-executed algorithm, using factors such as roof plane geometry and desired power output to set the arrangement in a manner that is, again randomized and generally uniform to the human eye. In further embodiments, a combination of both automated/software driven design and human/holistic placement can be applied to set the arrangement of solar cells for any given BIPV system. In further aspects, predetermined arrangements or configurations of solar cells and PV tiles can be used to account for and work around obstacles in a roof surface, or to form edges along the roof surface.

Tile and Wiring Layouts

Figure 8:
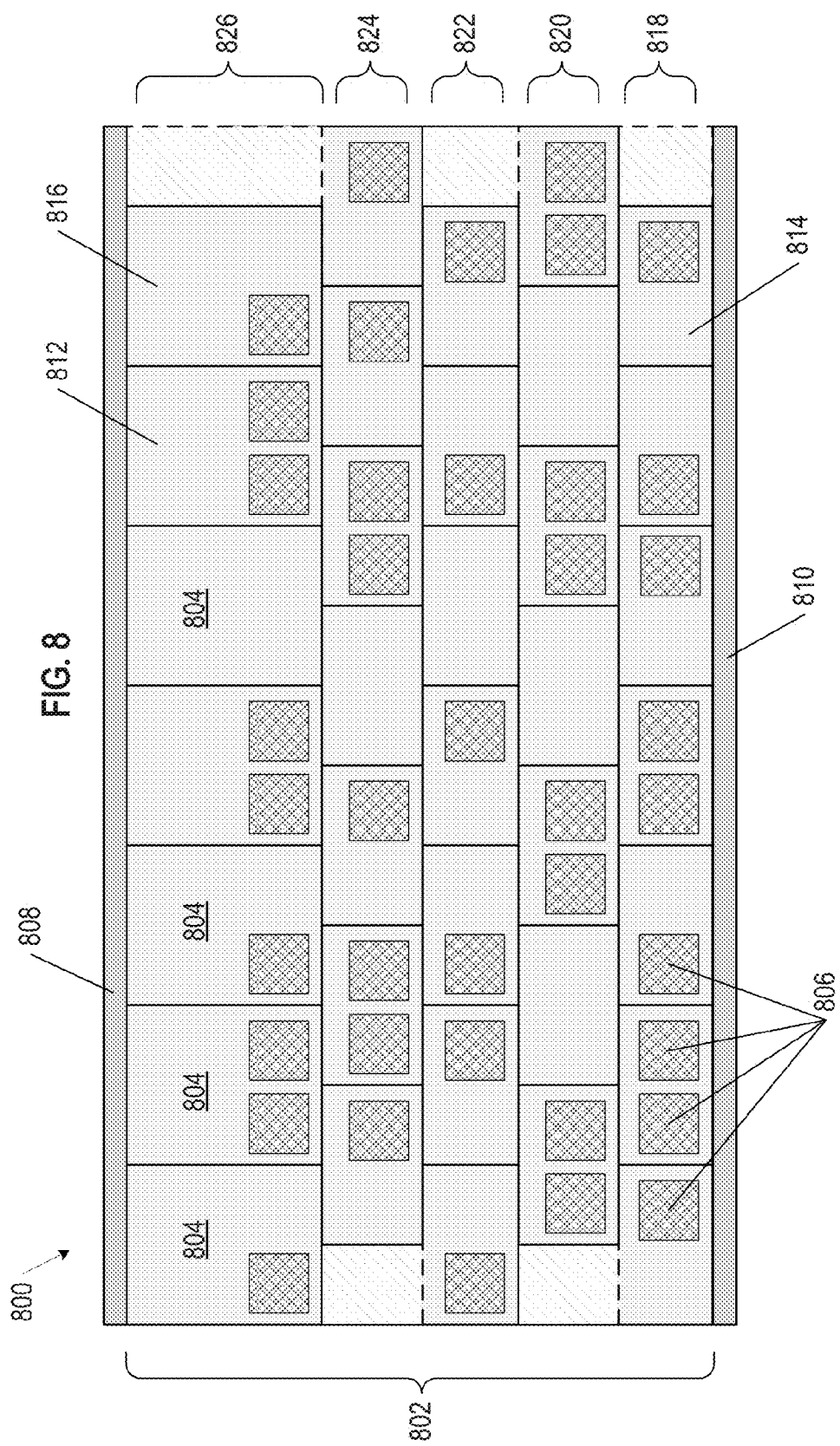
FIG. 8 is a schematic of an exemplary BIPV array forming a roof surface, with roof tiles arranged in multiple courses, in accordance with embodiments of the disclosure.

FIG. 8 is a schematic of an exemplary BIPV array 802 forming roof surface 800, with roof tiles 804 arranged in multiple rows or courses. Solar cells 806 are present on some roof tiles 804 on the right side, left side, or both sides of the reveal portion of roof tiles 804. Some members of BIPV array 802 are blank roof tiles. Ridge flashing 808 and eave flashing 810, in combination with BIPV array 802, complete roof surface 800.

Various courses of PV tiles are shown, with specific variation between the courses. First course 818 is formed with full PV tiles 812, right-half PV tiles 814, and left-half PV tiles 816; there are no blank roof tiles 804 in first course 818. Second course 820 is formed with full PV tiles 812 and blank roof tiles 804; there are no right-half PV tiles 814 or left-half PV tiles 816 in second course 820. Third course 822 is formed with blank roof tiles 804, right-half PV tiles 814, and left-half PV tiles 816; there are no full PV tiles 812 in third course 822. Fourth course 824 is formed with full PV tiles 812, right-half PV tiles 814, and blank roof tiles 804; there are no left-half PV tiles 816 in fourth course 824. Fifth course 826 is formed with full PV tiles 812, left-half PV tiles 816, and blank roof tiles 804; there are no right-half PV tiles 814 in fifth course 826. Of course, any given course for BIPV array 802 can have any variation of PV tiles and blank tiles, where the number and type of tiles can be selected to achieve a desired power output and aesthetic appearance.

Figure 9:
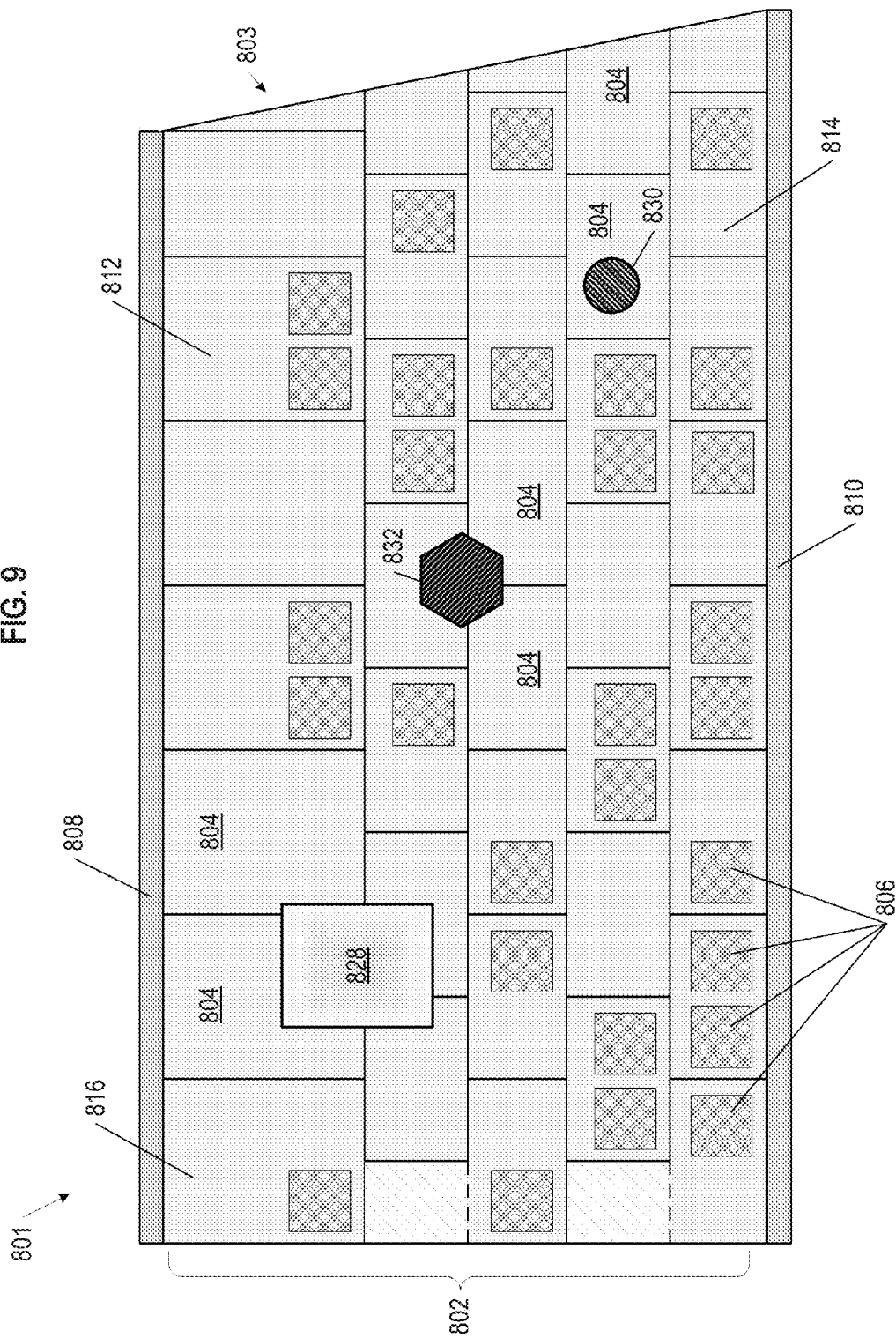
FIG. 9 is a schematic of an exemplary BIPV array forming a roof surface, with roof tiles arranged in multiple courses, where roof surface has various obstacles to work around when laying down roof tiles, in accordance with embodiments of the disclosure.

FIG. 9 is a schematic of an exemplary BIPV array 802 forming roof surface 801, with roof tiles 804 arranged in multiple rows or courses, where roof surface has various obstacles to work around when laying down roof tiles 804. In particular, roof surface 801 includes skylight 828, chimney 830, and vent 832. Each of skylight 828, chimney 830, and vent 832 can have different sizes, shapes, and positions on roof surface 801. Some roof surfaces 801 can have one or more skylights 828, chimneys 830, or vents 832. Blank roof tiles 804 can be cut and positioned around such obstacles or interruptions in roof surface 801. Further, roof surface 801 has an angled side edge 803, for which blank roof tiles 804 can also be cut or trimmed to terminating at angled side edges 803. In alternative aspects, a half-sized blank may be used as a pre-cut part (e.g., a half-SKU) to make fitting tiles on the roof easier with higher consistency and reliability, or to make cutting and trimming parts onsite easier and more efficient.

Figure 10:
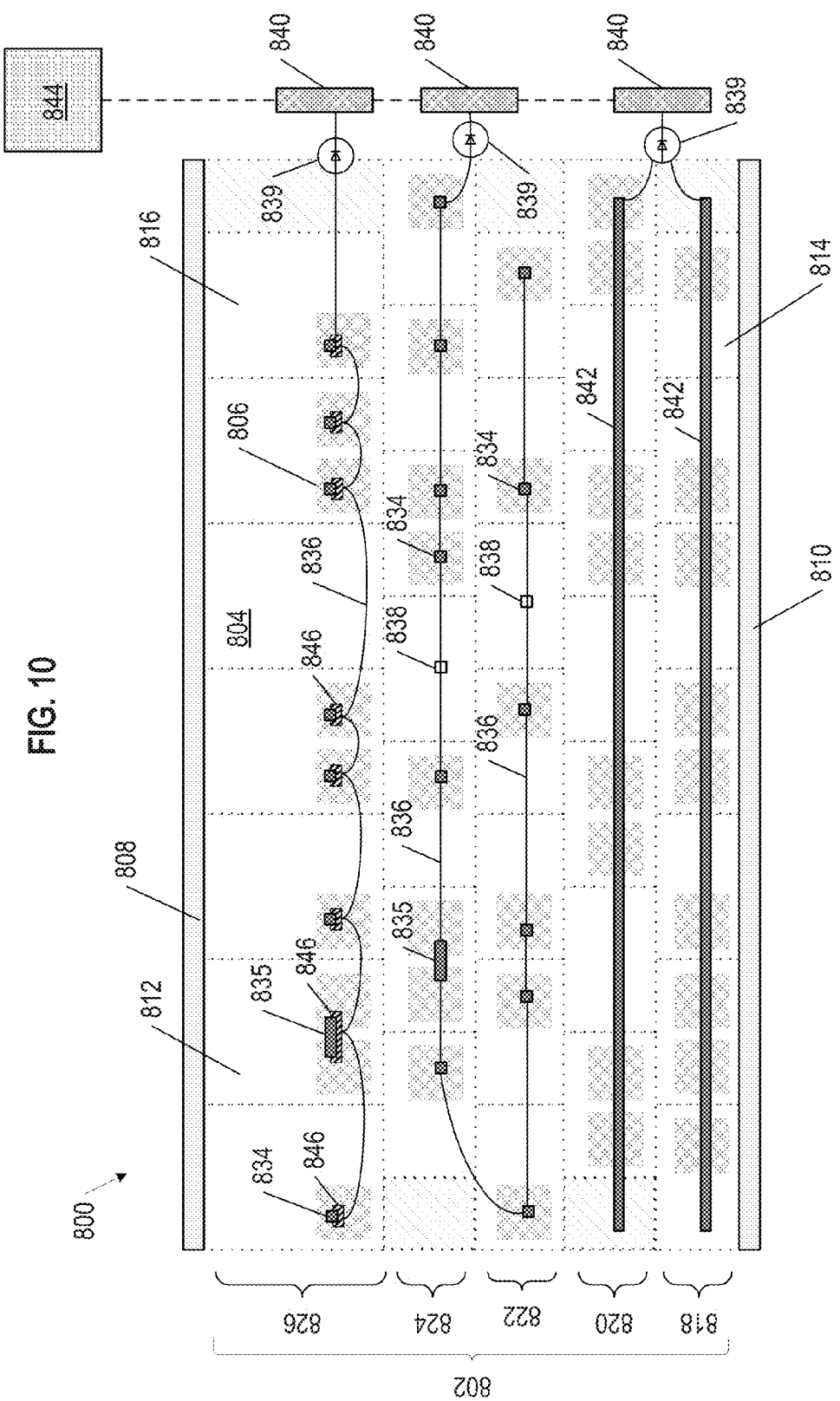
FIG. 10 is a schematic of roof surface showing electrical connections beneath tiles of a BIPV system, in accordance with embodiments of the disclosure.

FIG. 10 is a schematic of roof surface 800 showing electrical connections beneath tiles of BIPV array 802. In particular, FIG. 10 shows potential wiring connections using individual electrical connectors, harness connection system, and power bus track schemes. It can be understood that schematically, for clarity, electrical connectors are shown in locations overlapping with solar cells 806. For actual construction and installation, electrical connections can be physically located under regions of PV tiles that are more efficient both for the manufacture of individual tiles and minimize potential physical conflicts when assembling a roof (e.g. in or under a top or up-roof lapped portion of a PV tile).

In BIPV system 802, the PV tiles are necessarily electrically connected, such as with junction boxes 834, micro-inverters, DC optimizers, power bus bars 842, or other local/module-level electronics. In some embodiments, as shown in third course 822 and fourth course 824, solar cells 806 of the PV tiles can be electrically connected via wiring 836, coupling junction boxes 834 (or some other form of electrical connectors) on the back side of PV tiles, where the electrical connectors are located proximate to solar cells 806, on the opposite side of each PV tile. Accordingly, full PV tiles 812 can have two junction boxes 834, while right-half PV tiles 814 and left-half PV tiles 816 can each have one junction box 834. In some embodiments, dual junction box 835 can electrically connect two solar cells 806 on full PV tile 812. Blank roof tiles 804 do not need an electrical connection, but can further include mounting guide 838 to support and route wiring 836 on the underside of BIPV array 802. One or more rows or courses of electrically coupled PV tiles can connect to combination boxes 840, where combination boxes 840 can be voltage or current inverters, power meters, electrical drops, optimizers, transformers, or the like, which can then route electricity into the electrical main 844 of the building or toward the electrical grid. In some aspects, combination boxes 840 can be referred to as minor electrical boxes or terminal boxes. The electrical connection between wiring 836 and combination box 840 can pass through diode 839, where diode 839 can serve as a one-way gate to prevent electrical surges, reverse flow, and regulate current within BIPV array 802. Wiring 836 can be run underneath flashing or other roof construction components to a transformer or other central electrical main 844 of a building. Electrical connections between the PV tiles and combination boxes 840 or electrical main 844 can be made with an MC4 connector (a Multi-Contact 4 mm electrical connector), or other such direct current (DC) positive-locking electrical connector.

In other embodiments, as seen in first course 818 and second course 820, power bus bars 842 can also be used to electrically connect solar cells of the PV tiles. Individual power bus bars 842 can electrically connect PV tiles along part of a row, or an entire course of, PV tiles. Two or more power bus bars 842 can connect to combination boxes 840. All of the wiring schematics considered may further include a home run to connect BIPV array 802, via combination boxes 840 to a respective electrical main 844, or ultimately to a public or external electrical grid. In some aspects, power bus bars 842 can replace and serve as cross-battens, thereby also providing structure to roof surface 800, and maximizing use of space beneath roof tiles 804 of BIPV system 802. In other aspects, power bus bars 842 can have two tracks of electrical contacts (each of which can be continuous or discontinuous), such that PV tiles placed in between the two tracks can make electrical connections once arranged in a functional position (e.g. twisted into place such that electrical contacts on the PV tile touch the electrical tracks).

In other embodiments, as seen in fifth course 826, harness couplings 846 can electrically connect to junction boxes 834 (and/or dual junction boxes 835) on PV tiles. As shown, standardized electrical contacts can extend from PV tiles to which harness couplings 846 can quickly and easily attach to. Harness coupling 846 are wired together, providing an advantage in that wiring 836 does not need to be individually connected to every junction box 834 of a set of PV tiles, but rather the wiring 836 is securely and consistently connected to harness couplings 846 which simply plug into junction boxes 834.

Such strings of PV tiles, connected by wiring 836, harness couplings 846, or by power bus bars 840, can be a string of low voltage, high voltage, or intermediate voltage, depending on the specific building and desired power production. A low voltage architecture can be a string that builds to 50 V or a string that builds to 80 V. In other implementations, a string of PV tiles can build to a high voltage architecture of about 300 V-600 V. In some installations, it may be necessary to further include a rapid shutdown device (RSD) as part of the string, to ensure that the BIPV array 802 is code compliant as needed.

Figure 11:
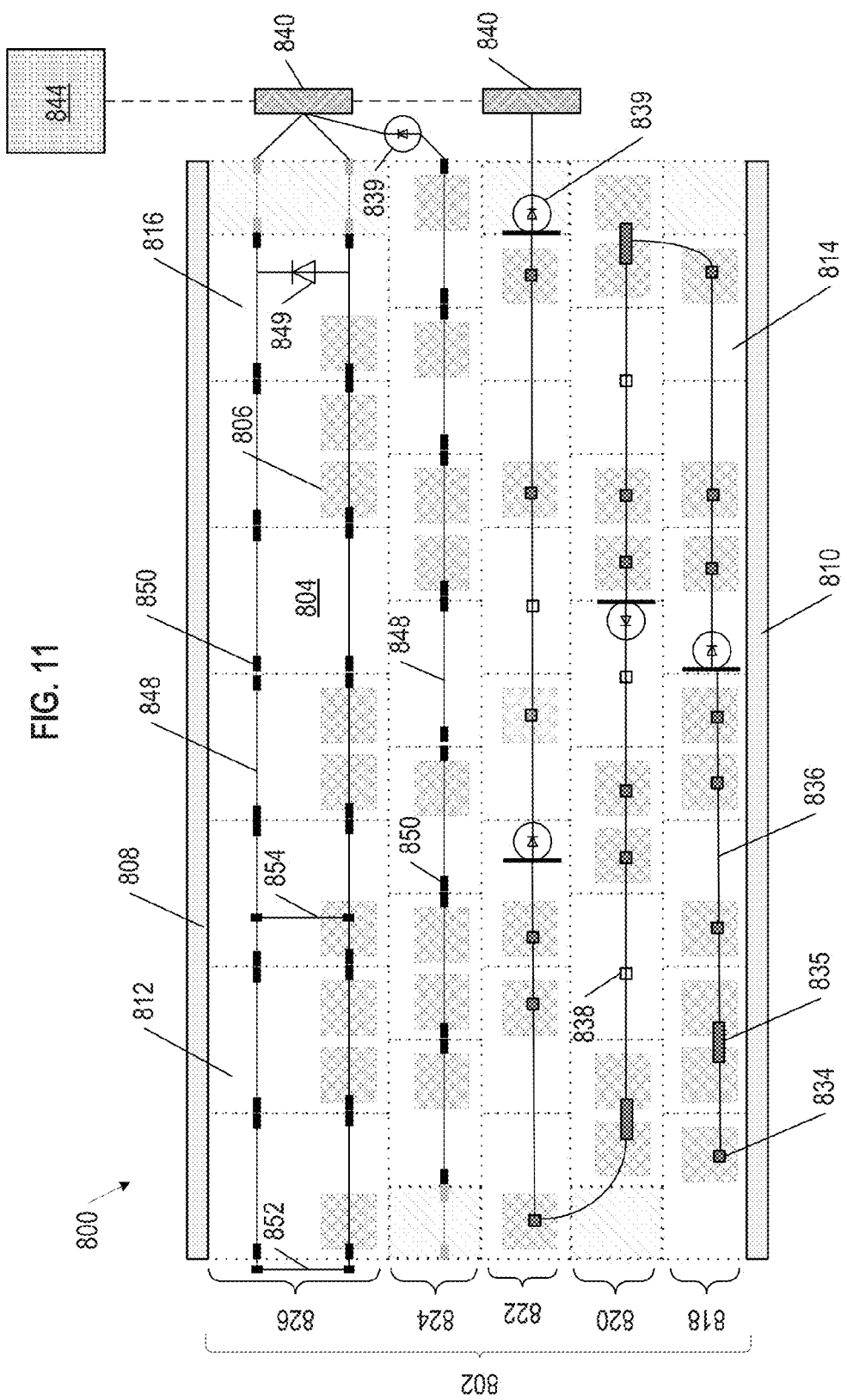
FIG. 11 is a schematic of roof surface showing other various electrical connections for tiles of a BIPV system, in accordance with embodiments of the disclosure.

FIG. 11 is a schematic of roof surface 800 showing alternative possible electrical connections for tiles of BIPV array 802. In particular, FIG. 11 shows potential wiring connections using strands of PV tiles electrically connected as a subset of elements (e.g. like a string of Christmas lights) and in-tile bussing connections. Again, it can be understood that for a clear schematic illustration, electrical connectors are shown in locations overlapping with solar cells 806, whereas the actual physical location of such electrical connections can be centered or anchored in other regions of a PV tile.

In some embodiments, as seen in first course 818, second course 820, and third course 822, various sets of the full PV roof tiles, left-half PV roof tiles, right-half PV roof tiles, and optionally the blank tiles can be electrically strung together in sets (e.g. like a string of Christmas lights) at the time of manufacture, and then installed as a set at a worksite. Preassembling such strands of PV tiles can provide for greater accuracy and consistency in assembly. In some aspects, such strands of PV tiles can include eight (8) to twelve (12) PV tiles, and thus up to from about sixteen (16) to twenty-four (24) solar cells 806; of course, in other implementations, PV tiles strands can have a greater or lesser number of PV tiles and/or solar cells 806. As shown, each strand of PV tiles can have diodes 839 terminating the strand, where each strand of PV tiles can have variable numbers of PV tiles and/or solar cells. In some aspects, a strand of PV tiles can have twenty (20) PV tiles, ten (10) PV tiles, five (5) PV tiles, or two (2) PV tiles. PV tile strands of various lengths can be used to lay roof tiles 804 over roof surface 800, mixing, matching, and fitting PV tile strands as appropriate for the unique contours of any given installation. In further aspects, single PV tiles may be used to fill in short or narrow regions of roof surface 800 where a longer PV tile strand would be inappropriate to use.

In some embodiments, as seen in fourth course 824 and fifth course 826, the PV tiles can have built-in power bussing, where the electrical connections are embedded wiring 848 within each individual PV tile, with tile connectors 850 on the sides of PV tiles capable of electrically connecting to adjacent PV tiles. Embedded wiring 848 in each PV tile, electrically connected to solar cells 806, allows for modular assembly of PV tiles with minimal need for additional wiring or external components. Indeed, PV tiles with embedded wiring 848 can also include embedded diodes 849 in some or all PV tiles of a built-in power bussing implementation of BIPV array 802, thereby providing for the protection and advantages of the one-way electrical gate without an additional element. Tile connectors 850 can be closely mounted or otherwise embedded within PV tiles, and arranged such that tile connectors 850 on adjacent PV tiles can directly electrically connect to each other or be connected with a minimal length of additional wiring. Alternatively, tile connectors 850 can include an amount of wiring slack such that tile connectors 850 can extend a short distance to couple with adjacent or proximate tile connectors. In such embodiments, some blank tiles can be direct bypass tiles, with embedded wiring 848 simply passing through PV tile. In other implementations a bypass whip (e.g., a short length of wiring 836) can connect tile connectors 850 on PV tiles separated by one or more blank roof tiles 804, without any electrical connection through blank roof tiles 804. Bypass whips may also be used to run from the end of course to the beginning of the next up-roof course of tiles.

In some embodiments, as seen in fourth course 824, built-in bussing embodiments can have embedded wiring 848 passing through PV tiles and always connecting to solar cells 806 in the respective PV tiles. In some embodiments, as seen in fifth course 826, built-in bussing embodiments can have more than one embedded wiring 848 path passing through PV tiles and connecting to solar cells 806 and also passing a home run line in the respective PV tiles. In further aspects, built-in power bussing embodiments can include end cap 852 connections, completing a circuit for a given region of PV tiles with embedded wiring 848. In other embodiments, jumper 854 can electrically connect two lines of embedded wiring 848 within one PV tile, or alternatively, between two PV tiles in vertically adjacent courses. In further variations, tile connectors 850 can be located either on opposite sides of PV tiles as shown, or on perpendicular edges of PV tiles (not shown) to allow for electrical coupling between vertically adjacent rows.

In both FIG. 10 and FIG. 11, while diodes 839 are shown connected in relation to one or more courses of PV tiles, or partial courses of PV tiles, diodes 839 can be allocated throughout BIPV array 802 based on power generated by a section or region of BIPV array, such that individual combination boxes 840 can appropriately handle subsets of PV tiles. In particular, combination boxes 840 rated to handle 300 W of power can be electrically coupled with three diodes 839, where each diode 839 is rated to handle 100 W of power. The number of PV tiles and correlated solar cells 806 that add together to generate 100 W of power can span one, two, or three or more courses of roof surface 800. In alternative aspects, combination box 840 can be an optimizer, and in particular an optimizer configured to handle lower power inputs. In further alternative aspects, diodes 839 can be replaced with micro-inverters or micro-optimizers, removing the need for combination boxes 840 as part of BIPV array 802. In various embodiments, if a currently available optimizer is utilized, it may be necessary to limit the string voltage of any particular string of tiles to be less than 300 volts—the limit on input voltage for such products.

In some aspects, optionally applicable to all embodiments of wiring layouts for BIPV arrays as considered herein, tiles that are electrically connected to each other can be so connected as wired on a common string, via a wire harness. In other aspects, photovoltaic tiles, non-photovoltaic tiles, or combinations thereof can be arranged adjacent to each other and coupled to a common support surface to form one or more sections of a solar roof surface.

In further alternative embodiments, PV tiles as discussed herein may be inductively coupled with an underlying power mat(s) or lattice. Such an induction-based system would eliminate the need for most wiring and physical connectors. The underlying power mat(s) or lattice would be disposed on a roof deck or battens of a roof structure, and electrically coupled with minor electrical boxes or optimizers that further connect with an electrical main box. PV tiles would be arranged and secured over corresponding sections of the power mat(s) or lattice, such that the underlying power mat(s) or lattice would receive electricity collected by solar cells through induction, and subsequently convey that electricity to the minor electrical boxes and/or electrical main box.

At combination boxes 840, a specific power point electrical load management can be implements to in order to control the overall BIPV array 802 and distribution of power. One or more channels or pathways can be tunneled or cut through portions of insulation or insulation layers in the underlying roof to run PV wires. In various embodiments, micro-inverters, DC optimizers, or other module-level electronics can optionally be electrically connected to one or more of PV tiles as part of overall array and BIPV system.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A building integrated photovoltaic (BIPV) roofing system comprising:
   at least one full PV tile;
   at least one left-half PV tile;
   at least one right-half PV tile;
   at least one blank non-PV roof tile;
   at least one full PV mimic tile;
   at least one left-half PV mimic tile; and
   at least one right-half PV mimic tile;
   wherein a plurality of full PV tiles, left-half PV tiles, right-half PV tiles, and blank non-PV roof tiles are arranged together in a non-regular pattern over a first section of a roof that receives incident solar energy at a specific power production rating per unit of roof area resulting in a first pattern density and corresponding to an aggregate power production capability ranging from 3,000 kW to 12,600 kW;
   wherein a plurality of full PV mimic tiles, left-half PV mimic tiles, right-half PV mimic tiles, and blank roof tiles are arranged on a second section of the roof in a non-regular pattern at the first pattern density and are not electrically coupled,
   thereby providing a consistent visual aesthetic to the first and second sections of the roof.

2. The roofing system of claim 1, wherein the plurality of full PV mimic tiles, left-half PV mimic tiles, right-half PV mimic tiles are disposed over other sections of the roof.

3. The roofing system of claim 1, wherein the plurality of full PV roof tiles, left-half PV roof tiles, and right-half PV roof tiles are electrically coupled via wiring positioned underneath the plurality of full PV tiles, left-half PV tiles, right-half PV tiles, and blank roof tiles.

4. The roofing system of claim 1, wherein the plurality of full PV roof tiles, left-half PV roof tiles, and right-half PV roof tiles are electrically coupled via power bus bars positioned underneath the plurality of full PV tiles, left-half PV tiles, right-half PV tiles, and blank roof tiles.

5. The roofing system of claim 1, wherein the plurality of full PV tiles, left-half PV tiles, right-half PV tiles, and blank roof tiles having the first pattern density are randomly distributed over the first section of the roof.

6. The roofing system of claim 5, wherein the plurality of full PV mimic tiles, left-half PV mimic tiles, right-half PV mimic tiles, and blank roof tiles having the first pattern density are randomly distributed over the second section of the roof.

7. A solar roof comprising:
   a first photovoltaic roof tile, having two solar cell modules;
   a second photovoltaic roof tile, having only one solar cell module biased toward a left side of the second photovoltaic roof tile;
   a third photovoltaic roof tile, having only one solar cell module biased toward a right side of the third photovoltaic roof tile;
   a non-photovoltaic roof tile;
   a series of electrical connectors electrically coupling the first photovoltaic roof tile, the second photovoltaic roof tile, and the third photovoltaic roof tile on a common string via a wire harness;
   a first photovoltaic dummy tile, having two silicon members;
   a second photovoltaic dummy tile, having one silicon member biased toward a left side of the second photovoltaic dummy tile; and
   a third photovoltaic dummy tile, having one silicon member biased toward a right side of the third photovoltaic dummy tile,
   wherein the first photovoltaic roof tile, the second photovoltaic roof tile, the third photovoltaic roof tile, and the non-photovoltaic roof tile are adjacent one another and coupled to a common support surface to form a first section of a solar roof surface and distributed on the roof surface in at a solar cell density to provide a desired load of power production capability,
   wherein the solar cell modules cover from 70% to 80% of the first section of the roof surface, and
   wherein the first photovoltaic dummy tile, the second photovoltaic dummy tile, the third photovoltaic dummy tile, and the non-photovoltaic roof tile are mechanically coupled to each other to form a second section of the roof surface.

8. The solar roof of claim 7, wherein the a plurality of first photovoltaic roof tiles, second photovoltaic roof tiles, third photovoltaic roof tiles carry an energy production load ranging from 3,000 kW to 12,600 kW.

9. The solar roof of claim 7, wherein a plurality of the first photovoltaic roof tile, the second photovoltaic roof tile, the third photovoltaic roof tile, and the non-photovoltaic roof tile are arranged in horizontal courses, where vertically adjacent horizontal courses are offset from each other by about half a photovoltaic tile width.

10. The solar roof of claim 7, wherein the electrically connected solar cell modules build up to have a voltage at the end of the wire harness of about from 50 V to about 80 V.

11. The solar roof of claim 7, wherein the electrically connected solar cell modules build up to have a voltage at the end of the wire harness of about 300 V.

12. The solar roof of claim 7, wherein one or more non-photovoltaic roof tiles are cut to fit around an obstacle in the roof surface.

13. The solar roof of claim 7, wherein the distribution and arrangement of the first photovoltaic roof tile, the second photovoltaic roof tile, the third photovoltaic roof tile, and the non-photovoltaic roof tile provide for a consistent visual aesthetic of the roof surface.

14. The solar roof of claim 7, wherein the distribution and arrangement of the first photovoltaic dummy tile, the second photovoltaic dummy tile, the third photovoltaic dummy tile, the first photovoltaic roof tile, the second photovoltaic roof tile, the third photovoltaic roof tile, and the non-photovoltaic roof tile provide for a consistent visual aesthetic of the roof surface.

15. The solar roof of claim 7, wherein:
- the first photovoltaic roof tile, the second photovoltaic roof tile, the third photovoltaic roof tile, and the non-photovoltaic roof tile are assembled as a string of structural elements for an energy production region of the roof surface; and
- wherein the first photovoltaic dummy tile, the second photovoltaic dummy tile, the third photovoltaic dummy tile and a further non-photovoltaic roof tile are assembled as a string of structural elements for an non-production region of the roof surface.

\* \* \* \* \*